(12) United States Patent
Leung

(10) Patent No.: US 6,924,493 B1
(45) Date of Patent: Aug. 2, 2005

(54) ION BEAM LITHOGRAPHY SYSTEM

(75) Inventor: Ka-Ngo Leung, Hercules, CA (US)

(73) Assignee: The Regents of the University of California, Oakland, CA (US)

( * ) Notice: Subject to any disclaimer, the term of this patent is extended or adjusted under 35 U.S.C. 154(b) by 774 days.

(21) Appl. No.: 09/641,467

(22) Filed: Aug. 17, 2000

Related U.S. Application Data

(60) Provisional application No. 60/149,512, filed on Aug. 17, 1999.

(51) Int. Cl.[7] .................. H01J 37/302; H01J 37/317

(52) U.S. Cl. ...................... 250/492.21; 250/492.23

(58) Field of Search ................. 250/492.21, 492.23, 250/492.2

(56) References Cited

U.S. PATENT DOCUMENTS 4,418,283 A * 11/1983 Trotel ..................... 250/492.2
6,486,480 B1 * 11/2002 Leung et al. .......... 250/492.21

* cited by examiner

*Primary Examiner*—Jack Berman
(74) *Attorney, Agent, or Firm*—Henry P. Sartorio; Joseph R. Milner

(57) ABSTRACT

A maskless plasma-formed ion beam lithography tool provides for patterning of sub-50 nm features on large area flat or curved substrate surfaces. The system is very compact and does not require an accelerator column and electrostatic beam scanning components. The patterns are formed by switching beamlets on or off from a two electrode blanking system with the substrate being scanned mechanically in one dimension. This arrangement can provide a maskless nano-beam lithography tool for economic and high throughput processing.

14 Claims, 23 Drawing Sheets

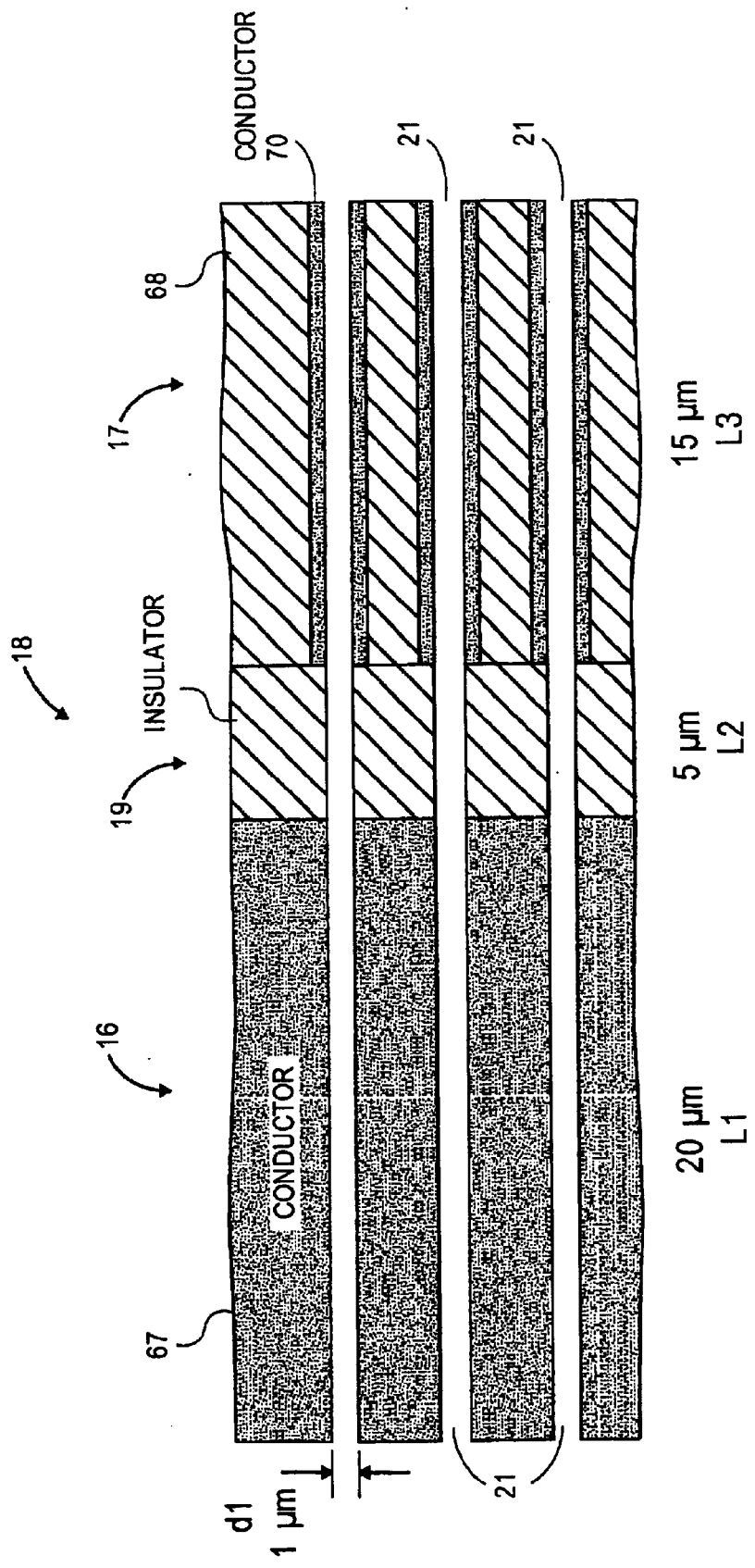

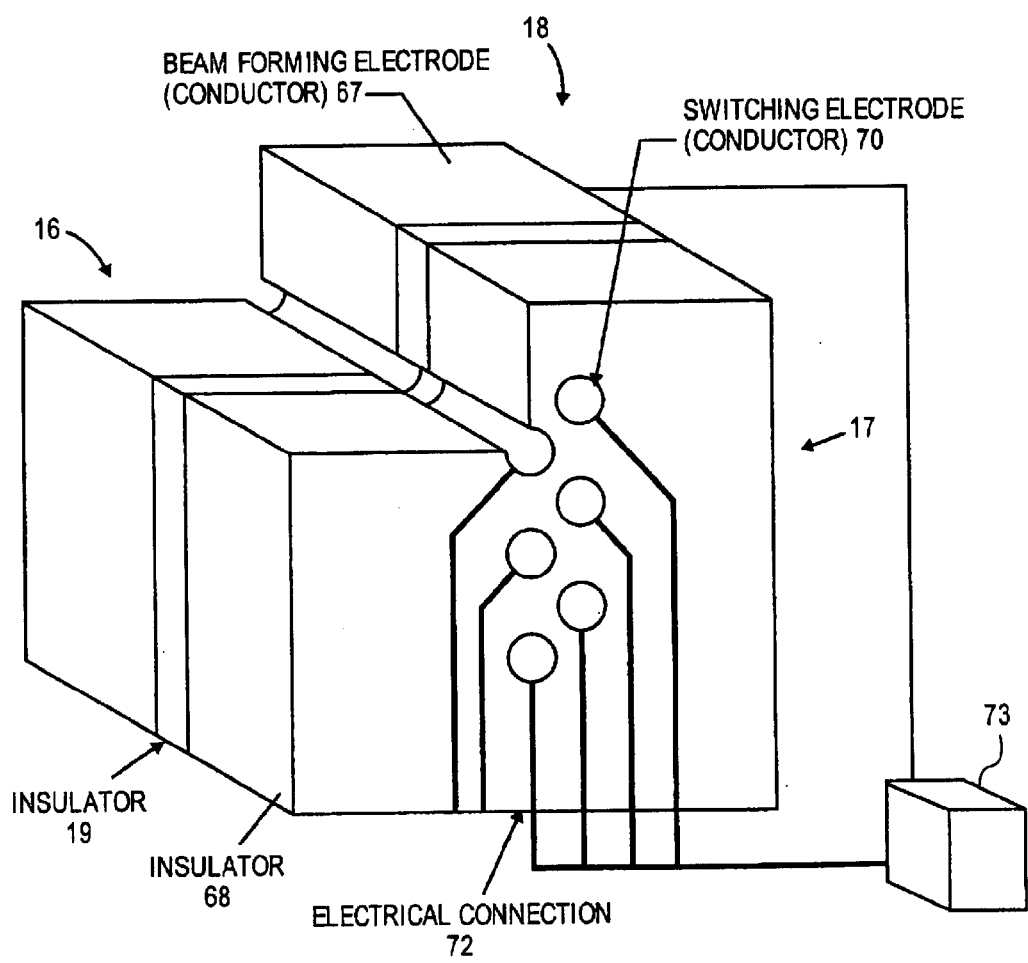

FIG. 6D FIG. 6E
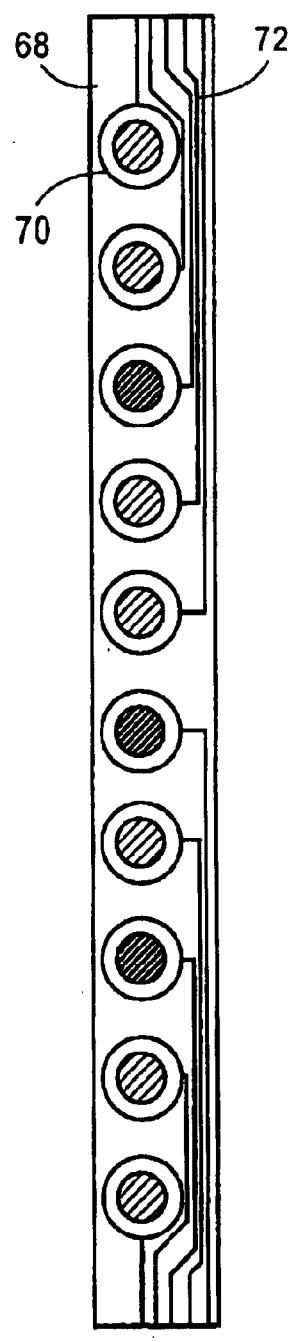
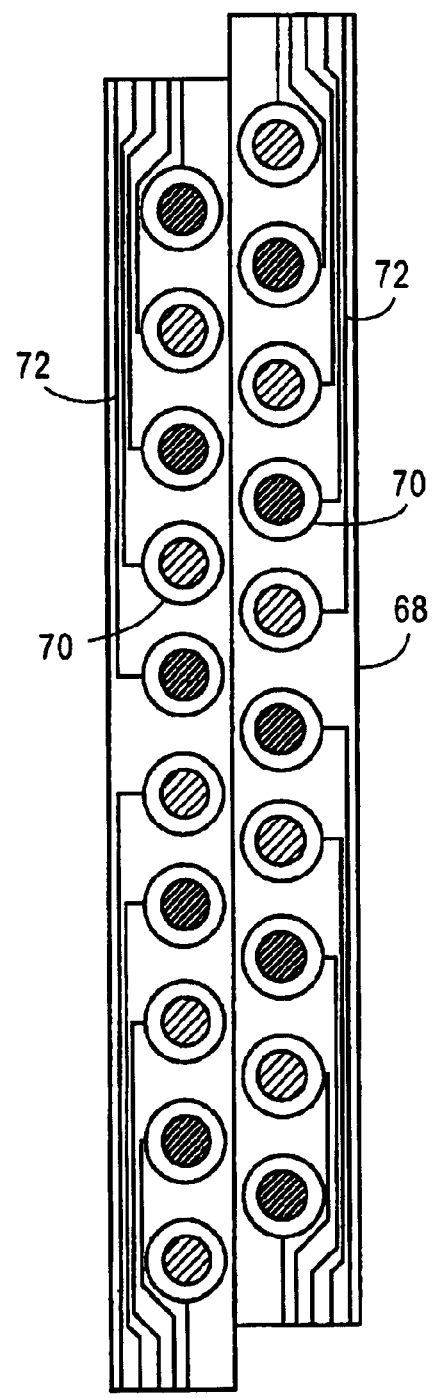

Beamlet Extraction from Pattern Generator

Beam Extraction E=300 kV/cm, Ø=1μm

FIG. 11 Beam Extraction E=27.5 kV/cm, Ø=1 μm

ION BEAM LITHOGRAPHY SYSTEM

RELATED APPLICATIONS

This application claims priority of Provisional Application Ser. No. 60/149,512 filed Aug. 17, 1999.

GOVERNMENT RIGHTS

The U.S. Government has rights in this invention pursuant to Contract No. DE-AC03-76SF00098 between the U.S. Department of Energy and the University of California.

BACKGROUND OF THE INVENTION

The invention relates generally to ion beam lithography and more particularly to proximity print type ion beam lithography capable of producing sub-50 nm feature size.

If microelectronics manufacturing is to continue its progress toward ever higher levels of performance and integration as well as lower cost per function, alternative lithographic techniques will be needed in order to resolve features of 50 nm and smaller. These techniques must offer high process throughput and reasonable cost per wafer. Many of the alternative lithography technologies explored thus far, such as X-ray, extreme-ultraviolet (EUV), electron-beam (e-beam), and ion-beam lithography, have been handicapped by complicated mask technology and/or low throughput.

The tremendous challenges associated with mask technology have provided incentive for exploring maskless approaches to lithography, such as the two different ones that are presently being investigated at the Lawrence Berkeley National Laboratory (LBNL). These two approaches could potentially have a revolutionary impact on the semiconductor industry. They are focused-ion-beam maskless direct-write lithography and masklesss ion beam projection lithography.

Focused ion beam (FIB) patterning of films is a well-established technique in semiconductor manufacturing (e.g., for mask repair), but throughput has historically been a prohibitive issue in its application to lithography. At LBNL a practical FIB system for high-throughput maskless and direct (resistless) patterning and doping of films is being developed. A compact FIB system using a multicusp ion source and a novel electrostatic accelerator column is being built to generate ion beams of various elements with final beam spot size <0.1 $\mu$m and current in the $\mu$A range for resist exposure, surface modification and doping. Incorporating a fast beam scanning technique in the accelerator column eliminates the need of a stencil mask and of resist. Parallel wafer processing with multiple beams can greatly enhance the throughput of a FIB system. A multiple-beam system can be built by stacking a multi-aperture electrode-insulator structure so that each beam is accelerated with the same electrode potentials. The FIB system is described in U.S. Pat. No. 5,945,677.

The Maskless Micro-ion-beam Reduction Lithography (MMRL) system takes a different approach than a conventional ion beam projection lithography (IPL) tool. The conventional IPL system needs a divergent beam from an ion source with very low energy spread. The beam is accelerated to 10 keV and is made parallel before impinging on a stencil mask. The stencil mask is a very thin membrane (~3 $\mu$m thick) with open holes for beam passage. After exiting from the stencil mask, the beam is further accelerated and then demagnified to form a parallel beam again. The ion source, beam optics design and the stencil mask are extremely complicated and many engineering issues have to be resolved before a practical system can be realized. The MMRL system eliminates the first stage of the conventional IPL machine. The stencil mask is replaced by a patternable multi-beamlet system or universal pattern generator. The beam reduction column is all-electrostatic and has a much simpler design. The MMRL system is described in copending U.S. application Ser. No. 09/289,332.

While these two approaches both offer significant advantages, particularly the elumination of the stencil mask, they both involve accelerator columns, even though they may be more compact than conventional columns. It would be desirable to provide an ion beam lithography system which eliminates the need for an accelerator column to focus the ion beam and to reduce the feature size of a beamlet pattern produced by a universal pattern generator.

SUMMARY OF THE INVENTION

The Maskless Nano-Beam Lithography (MNBL) system of the present invention is a proximity print type of lithography system rather than a projection system. It takes a combined approach of certain aspects of the MMRL and FIB systems, and eliminates the accelerator or reduction column. It employs the same beamlet switching technique as MMRL, i.e. a universal pattern generator. Unlike the FIB system which operates with four or more electrodes, the MNBL system contains a single ion beam focusing element which is part of the beam extractor. The system is very compact and can be operated with multiple $H^+$, $H^-$ or other inert gas ion beams without a cross-over. The focused ion beamlets are independent of each other. As a result, this MNBL system can pattern large flat or curve substrate area without distortions but with very high throughput. It is ideal for generating small pattern features with dimensions less than 50 nm.

The system is a direct print or proximity print system, i.e. no reduction column is used to demagnify a mask pattern to produce small feature size. The wafer or substrate to be exposed is placed very close to the mask or pattern generator. However, instead of a mere 1:1 projection of the mask or pattern generator feature sizes, reduction by factors of at least 10 to 30 or more can be produced by using the focusing properties of the plasma generator extraction system. The mask or pattern generator of the lithography system is used as the exit or extraction electrode of the plasma generator. While a simple fixed pattern mask can be used, a universal pattern generator is preferred since it can produce various patterns. Both types of masks are much thicker than the conventional stencil masks used in ion beam systems. By applying a low voltage to the pattern generator/exit electrode, beamlets of low energy plasma are extracted. By applying a high voltage between the pattern generator/exit electrode and the substrate, the extracted beamlets can be focused onto the substrate, providing the desired demagnification without a reduction column.

BRIEF DESCRIPTION OF THE DRAWINGS

FIGS. 6A, B illustrate a pattern generator—beamlet extractor.

FIGS. 6C–E illustrate a dot matrix arrangement, a single column arrangement, and a double column arrangement of the apertures in the second electrode.

DETAILED DESCRIPTION OF THE INVENTION

Figure 1:
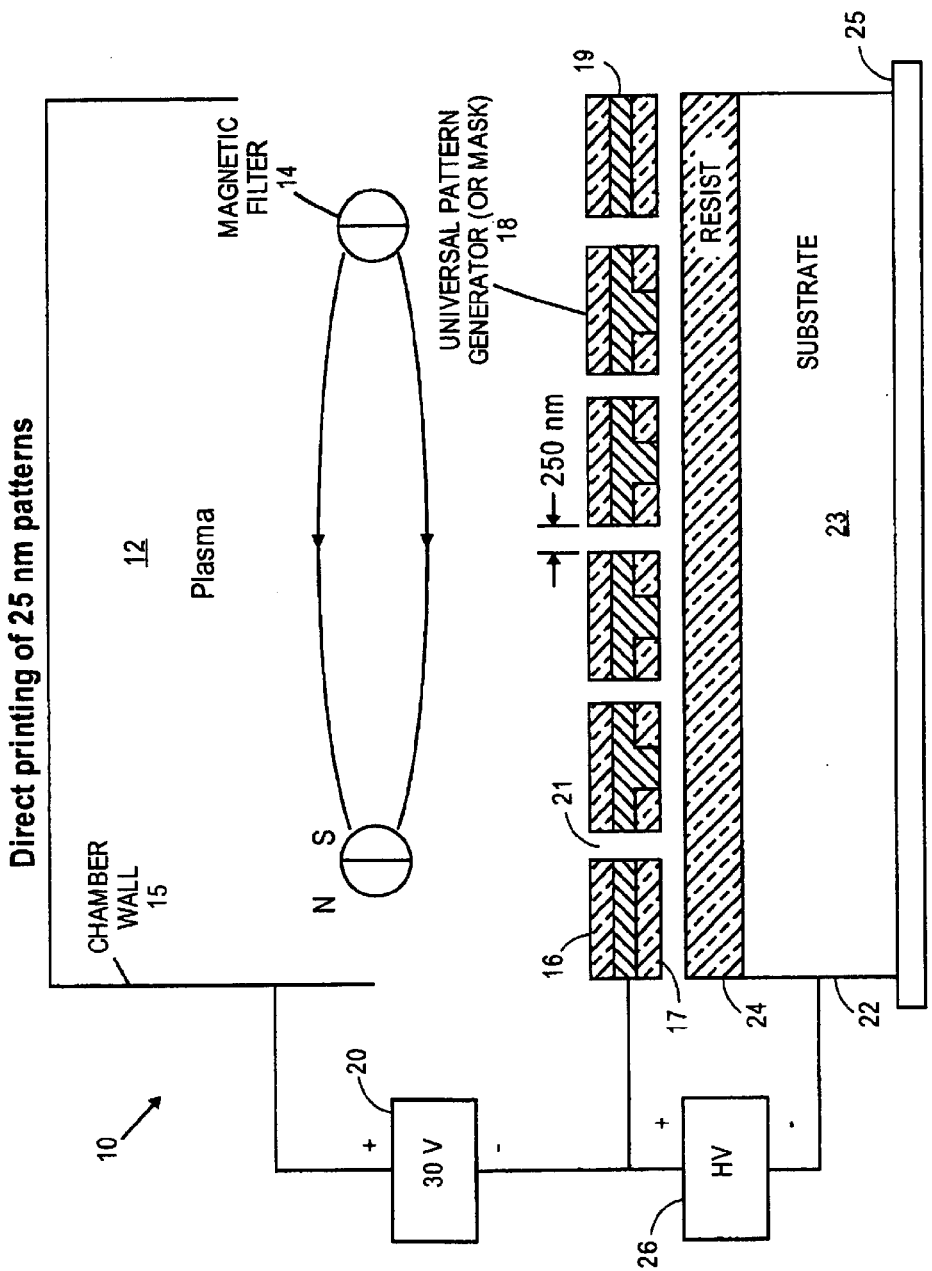
FIG. 1 illustrates the Maskless Nano-Beam Lithography (MNBL) system of the invention.

The principle of the Maskless Nano-Beam Lithography (MNBL) system 10 is illustrated in FIG. 1. A hydrogen (or other) plasma is first generated in a (multicusp) plasma ion source 12. The plasma will diffuse across a permanent-magnet filter 14 which can greatly reduce the axial energy spread of the positive hydrogen ions. The positive ions will accelerate towards the plasma electrode 16 (the first electrode of the pattern generator 18) with an energy of ~25 eV. A low voltage, e.g. about 30V, power supply 20 connected between chamber wall 15 and pattern generator 18 provides a bias voltage to accelerate the ions towards electrode 16. Pattern generator 18 is formed of a pair of electrodes 16, 17 separated by an insulator 19 and a plurality of apertures 21 are formed in pattern generator 18. As the ions emerge from the apertures 21, the ion beam made up of the beamlets which pass through the apertures 21 will be further accelerated to the wafer target 22 which is formed of a wafer or substrate 23 coated with a resist layer 24. A high voltage (HV) source 26 connected between pattern generator 18 and wafer target 22 provides the acceleration for the ion beam, and also provides a focusing effect. Wafer target 22 may be mounted on a translatable stage 25.

The wafer target 22 is positioned close to the pattern generator 18. Due to the curvature of the equipotential surfaces of the electric field between the wafer target 22 and pattern generator 18 into the apertures 21, the ions will experience a focusing force and therefore converge to a much smaller spot size than the aperture diameter. The location of the focal point and its beam spot size are determined by several parameters; such as the aperture diameter, the beam current and the strength of the applied electric field. Large demagnification can be produced.

The MNBL system 10 is made up of the following major components:

a) Ion Source—Multicusp Plasma Generator

Figure 2A:
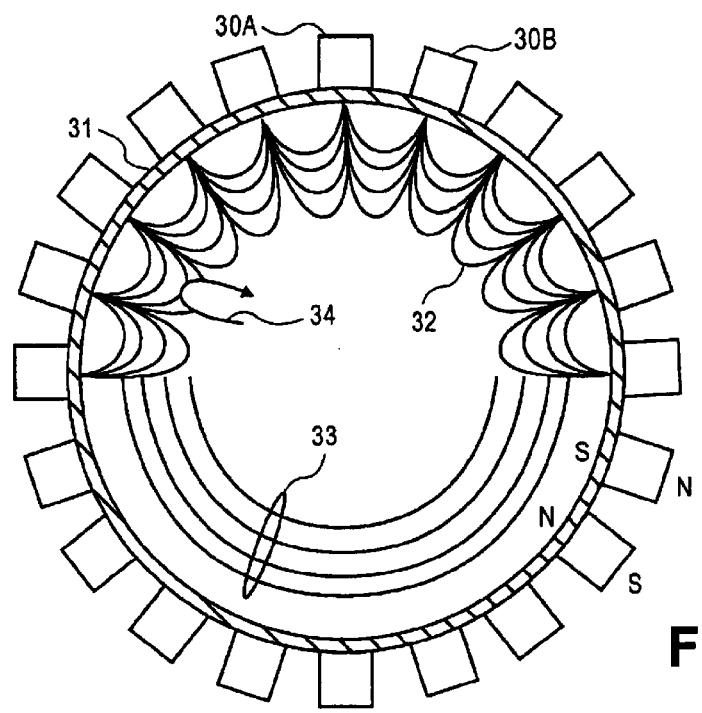
FIG. 2A illustrates the magnetic cusp fields in a multicusp ion source.
Figure 2B:
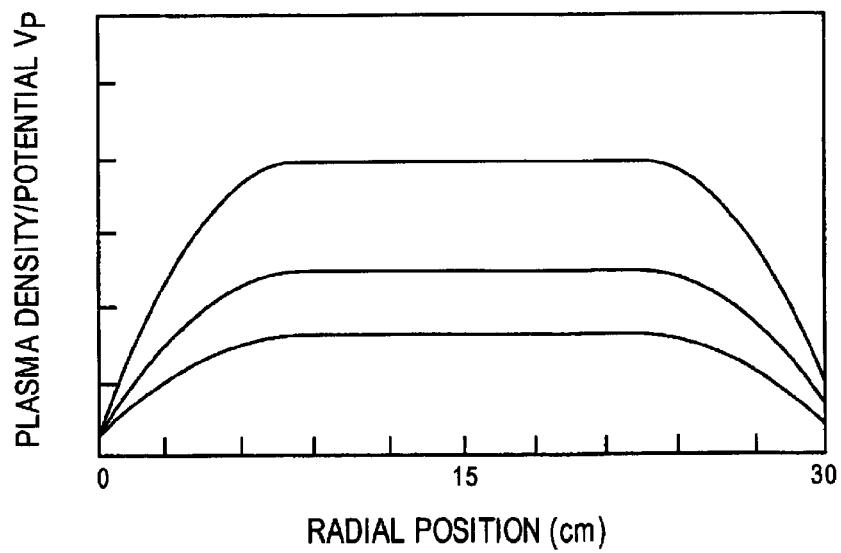
FIG. 2B shows the radial plasma density profile for a multicusp ion source.

The multicusp plasma generator is very suitable for this application because it can provide either positive or negative hydrogen ions (or ions of inert gases) with very low axial energy spread. As shown in FIG. 2A, the external surface of the chamber 31 is surrounded by columns of permanent magnets 30a, 30b of alternating polarity which form multicusp fields 32 for primary ionizing electron and plasma confinement. The cusp fields are localized near the chamber wall, producing contours 33 of constant field strength and leaving a large portion of the source free of magnetic fields. Plasma loss is inhibited as indicated by ion trajectories 34. As a result, this type of device can generate large volumes of uniform and quiescent plasmas as illustrated by the radial density profiles shown in FIG. 2B. Plasma uniformity and quiescence are important criteria for generating low ion temperature. As a particular example, a 30-cm-diameter chamber is used and a uniform plasma volume of about 18-cm-diameter is formed. In principle, larger uniform plasmas can be generated by using a bigger source chamber and a well-designed permanent magnet configuration.

Figure 3:
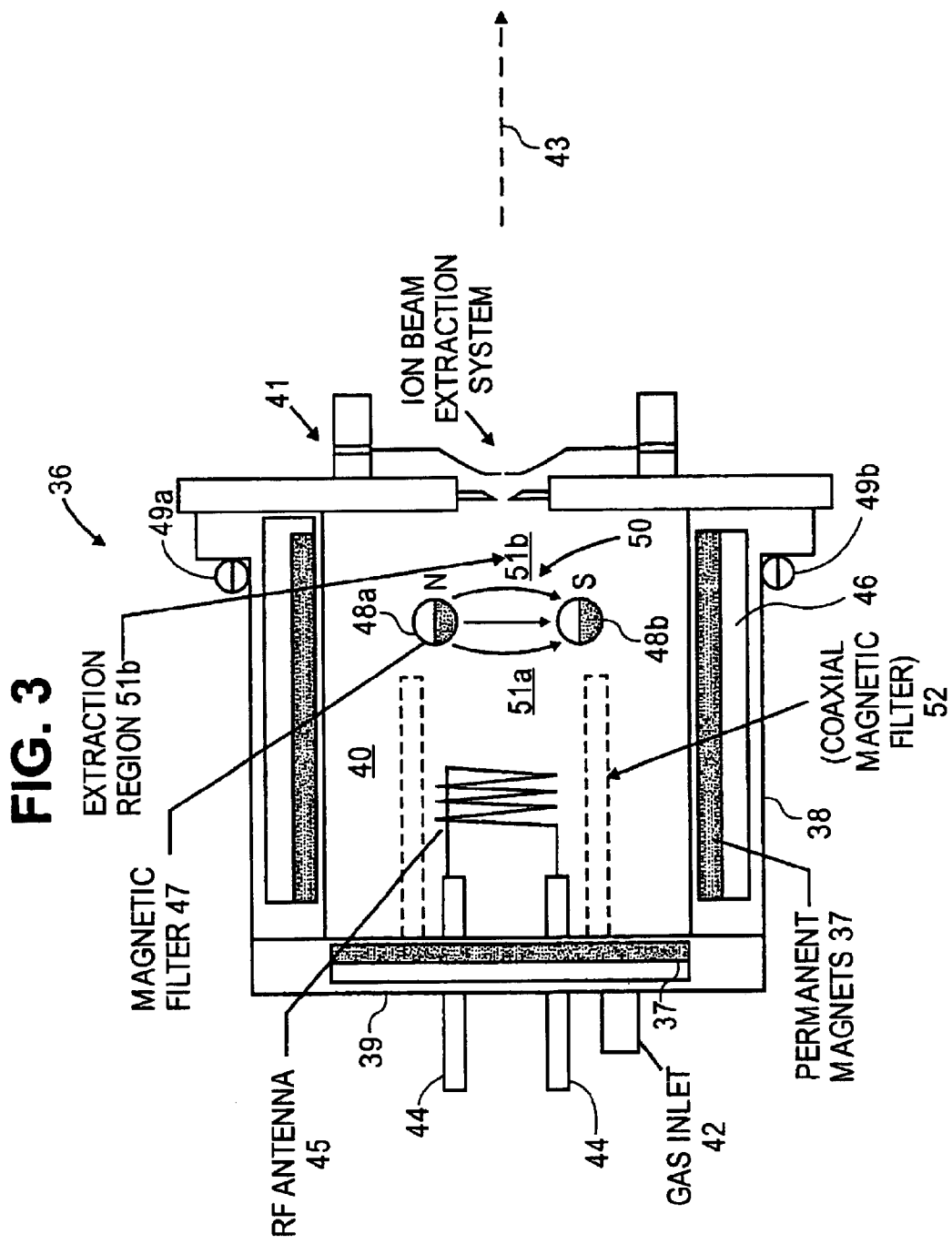
FIG. 3 shows a RF driven multicusp ion source.

The plasma of the multicusp source can be produced either by dc filament discharge or radio-frequency (RF) induction discharge. For the MNBL, an RF-driven hydrogen plasma will be used. FIG. 3 shows a multicusp ion source with a quartz antenna coil. The quartz antenna will not generate impurities and there is no radiation heating on the first electrode of the pattern generator due to the absence of hot tungsten filaments. The plasma discharge can be operated either in cw or pulsed mode. The extractable ion current density is controlled by adjusting the RF input power. The RF multicusp source can be routinely operated with input power higher than 5 kW.

As shown in FIG. 3, source 36 has an internal chamber 40. The permanent magnets 37 can be arranged around the lateral (typically cylindrical) wall 38 in rows parallel to the beam axis 43. Alternatively, they can be arranged in the form of rings perpendicular to the beam axis 43. The back plate 39 also contains rows of the same permanent magnets 17. Antenna feedthroughs 44 in back plate 39 also provide for mounting an antenna 45 in chamber 40. Water jackets 46 may also be provided in lateral wall 38 for cooling. Gas inlet 42 in back plate 39 allows a gas to be introduced from which the ions are produced.

The open end of the ion source chamber 40 is closed by extractor 41 formed of a set of extraction electrodes 42a, b which contain central apertures through which the ion beam can pass. In the MNBL system, the extractor 41 is the universal pattern generator or mask which is used to produce the pattern to be transferred to the wafer. The plasma density in the source, and therefore the extracted beam current, depends on the magnet geometry, the discharge voltage and current, the biasing voltage on the first extraction electrode, and the size of the source chamber.

A permanent magnet filter 47 formed of a spaced pair of magnets 48a, b of opposite polarity can be installed in the multicusp source 36. Filter 47 extends radially i.e. the magnets 48a, b are in a plane that extends radially across the chamber, dividing the source chamber 40 into two axially separated regions, plasma production region 51a and extraction region 51b. Antenna 45 is in plasma production region 51a while extraction region 51b is adjacent extractor 41. The filter 47 improves the atomic ion fraction, the source operability, the plasma density profile at the extraction plane, and the uniformity of the plasma potential along the axis.

Filter 47, generated either by inserting small magnets 48a, b into the source chamber 40 or by installing a pair of dipole magnets 49a, b on the external surface of the source chamber, provides a narrow region 50 of transverse B-field that is strong enough to prevent the energetic ionizing electrons produced by antenna 45 from reaching the extraction region 51b, but is weak enough to allow the plasma formed in plasma production region 51a to leak through. The absence of energetic electrons will prevent the formation of molecular ions in the extraction region, but dissociation of the molecular ions can still occur. As a result, the atomic ion species percentage in the extracted beam is enhanced. A coaxial magnetic filter 52 could also be used instead of radial filter 47.

Figure 4:
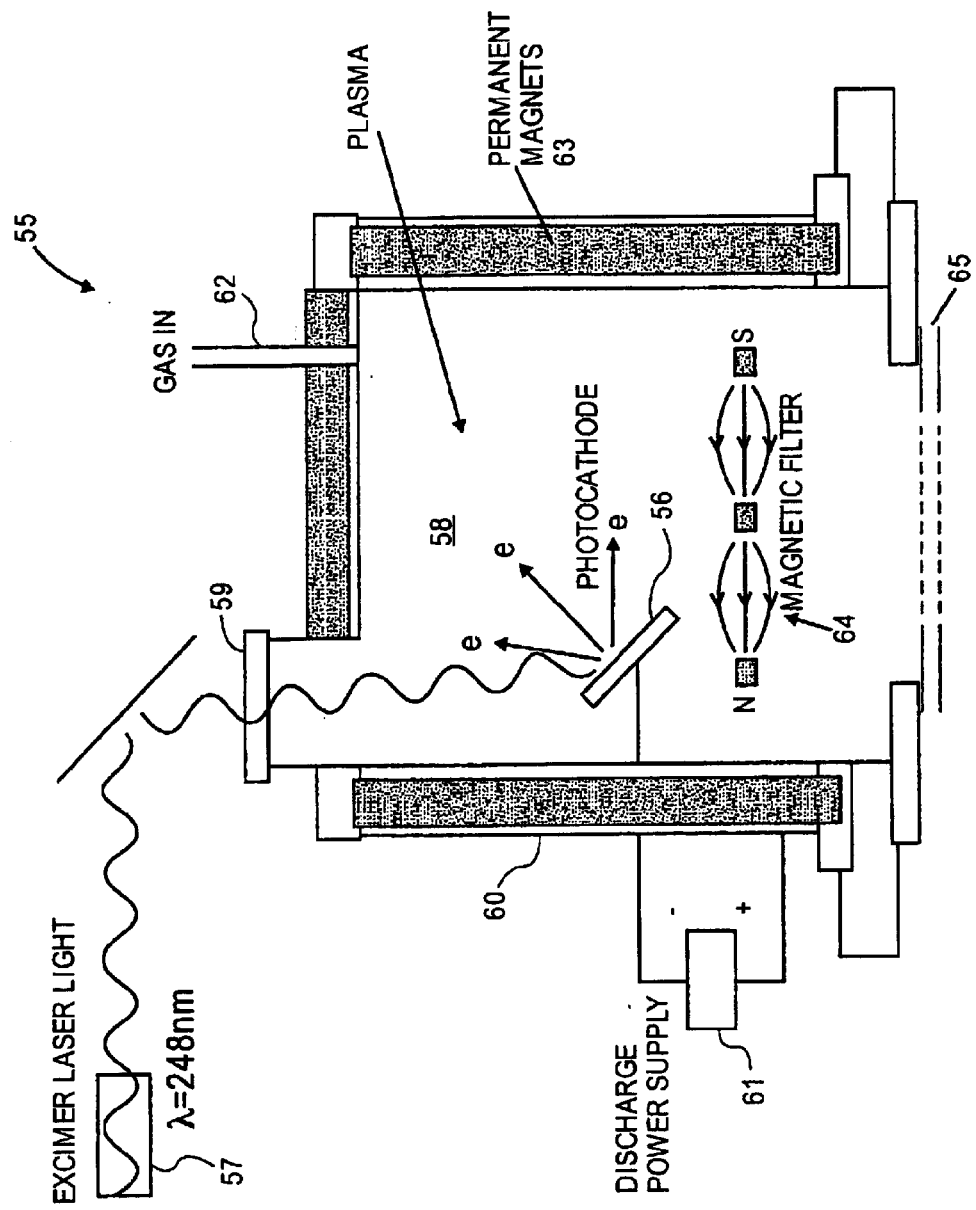
FIG. 4 shows a laser driven multicusp ion source.

In addition to RF induction discharge driven ion sources, a laser-driven multicusp plasma source 55, as shown in FIG. 4, may also be used. The RF induction coil is replaced by a photo-cathode 56 which is made of low work-function material such as magnesium or $LaB_6$. Light from an excimer laser 57 ($\lambda=243$ nm) enters the source chamber 58 through a quartz window 59 and impinges on the photo-cathode surface. If the photon energy is higher than the surface work function, electrons will be emitted due to the photoelectric effect. If the photo-cathode is biased negatively (e.g. 100 V) with respect to the chamber wall 60 by discharge power supply 61, the photoemission electrons will be accelerated towards the anode walls and will therefore ionize the background gas neutrals. This technique of plasma generation is simple and the laser can be located at ground potential and at any distance from the source chamber. Depending on the characteristics of the laser, the source plasma can be operated at cw or pulsed mode. Except for the different excitation mechanism, the source is similar to the RF driven source. Gas is introduced into chamber 58 through gas inlet 62. Permanent magnets 63 are used to create a multicusp field. A magnetic filter 64 is included in the source. The plasma beam is extracted through a two electrode extractor 65 which is the pattern generator or mask.

Figure 5:
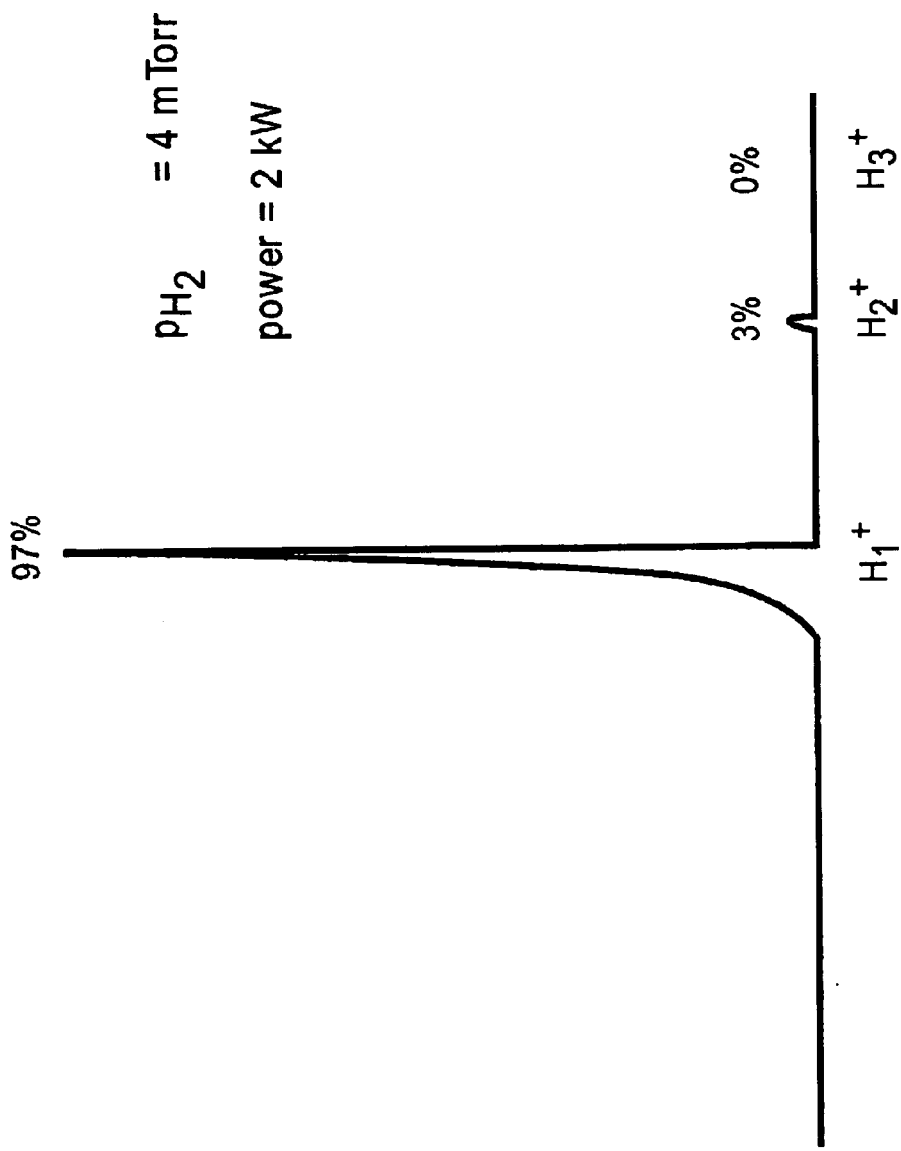
FIG. 5 is the hydrogen ion spectrum for an RF-driven multicusp source operated with a magnetic filter.
}

For normal source operation, a permanent-magnet filter installed inside the multicusp source chamber serves three purposes:

(1) It enhances the percentage of atomic hydrogen ion species. In order to maximize the depth of penetration into the resist, a pure $H^+$ ion beam is desired. The molecular $H_2^+$ and $H_3^+$ ions will form hydrogen atoms with one half or one third of the acceleration energy when they impinge on the resist and therefore the penetration depth is much reduced. The filter provides a limited region of transverse B-field which is strong enough to prevent the energetic ionizing electrons from reaching the extraction region but is weak enough to allow the plasma to leak through. The absence of energetic electrons will prevent the formation of $H_2^+$ ions in the extraction region and thus enhance the atomic ion species percentage in the extracted beam. The mass spectrum shown in FIG. 5 demonstrates that $H^+$ ion concentration as high as 97% can be obtained from an RF-driven multicusp source operated with a magnetic filter.

(2) It reduces the axial energy spread $\Delta E$ of the $H^+$ ion beam. The origin of the energy spread arises from the non-uniform plasma potential distribution in the ion production region of the source. The difference between the maximum and the minimum values and therefore the axial energy spread depends on the discharge power. Higher discharge power results in larger $\Delta E$. By installing a permanent-magnet filter in the source chamber, the plasma potential distribution in the source or ion production region becomes more uniform. As a result, the ion energy spread is reduced to about 1 eV or less.

(3) It increases the volume-produced $H^-$ ion density. A hydrogen plasma contains not only positive ions and electrons, but also $H^-$ ions. In volume production, the processes of dissociative attachment, dissociative recombination and polar dissociation occur. Dissociative attachment dominates in a typical hydrogen plasma. It is a two step process in which an energetic (~100 eV) electron excites $H_2$ into a high vibrational state which then picks up a cold (~1 eV) electron, thereby dissociating into a $H^-$ and a $H^0$, the cross-section increasing rapidly with the vibrational state. A permanent-magnet filter divides the multicusp source into a discharge and an extraction region. Excitation and ionization of the gas molecules are performed by the energetic electrons in the discharge region. In the extraction region, the low electron temperature makes it favorable for the production and survival of $H^-$ ions. $H^-$ current density >250 $mA/cm^2$ has been extracted from a filtered multicusp source. The energy spread of these volume-produced $H^-$ ions is <1 eV. In order to address the voltage holding and resist charging issues, one may have to employ $H^-$ rather than $H^+$ ion beam in this lithography technique.

b) The Ion Beam Extractor and Pattern Generator

The open end of the multicusp chamber is enclosed by a mulibeamlet ion beam extraction system which in this case is also the pattern generator. The pattern generator is formed of a spaced pair of electrodes and electrostatically controls the passage of each individual beamlet to form a predetermined beamlet pattern to be transferred to the wafer.

A pattern generator—beamlet extractor 18, as shown in FIGS. 6A, B, has a first electrode 16 which is the plasma or beam forming electrode and a second electrode 17 which is the extraction or beamlet switching electrode. Thus there are two conducting electrodes for each beamlet in the extraction system, and they are separated by a layer 19 of electrically insulating material.

First electrode 16 is formed of a conductor 67 having a plurality of apertures or channels 21 formed therein. The apertures 21 on the extractor 18 will be positioned within the uniform plasma density region of the source. Second electrode 17 is formed of an insulator 68 having a plurality of apertures or channels 21 formed therein. Each channel 21 contains an annular conductor 70 which is electrically connected by electrical connection 72 to a programmable voltage source 73 which can apply different voltages to each of the annular conductors 70. Conductor 67 is also connected to voltage source 73 or to a separate source. Electrodes 16, 17 are separated by an insulator 19. Channels 21 are aligned through electrodes 16, 17 and insulator 19. Conductor 67, insulator 19, and insulator 68 have thickness of L1, L2, L3 respectively. Typical values are L1=20 $\mu$m, L2=5 $\mu$m, and L3=15 $\mu$m, for a total thickness of about 40 $\mu$m which is much thicker than the thickness of a typical stencil mask. The diameter of the channels 21, through the pattern generator 18 is d1, typically about 1 $\mu$m to 250 nm, which are relatively large compared to the desired feature sizes and thus relatively easy to make.

In operation, the first electrode is biased negatively, about 30 V, with respect to the ion source chamber wall. A very thin plasma sheath is formed parallel to the first electrode surface. Positive ions in the plasma will fall through the sheath and impinge perpendicular to the electrode with an energy of about 30 eV. Ions will enter the apertures of the first electrode forming multiple beamlets. With such low impact energies, sputtering of the electrode will not occur. In addition, the heating power generated by ions on the electrode is extremely small and will not produce any instability of the extraction system. Because of low incoming energy, ion scattering inside the aperture channels is minimized. The ions will be absorbed on the channel surfaces rather than forming aberrated beams as they leave the apertures.

In the second electrode, if the annular conductors surrounding each aperture channel are also biased at the same potential as the first electrode, then ions will leave the apertures with an energy of about 30 eV. However, if the annular conductors of the second electrode are biased positively with respect to the first electrode, then the flow of ions to the aperture exit will be impeded by the electrostatic field. If this bias voltage is high enough, then the beam output will essentially become zero, i.e. the beam is turned off. Since the voltage on each annular conductor of the second electrode can be independently controlled, each individual beamlet can independently be turned on and off. Thus any desired beamlet pattern can be produced by the pattern generator, and the pattern can easily be switched to a different pattern.

Figure 6C:
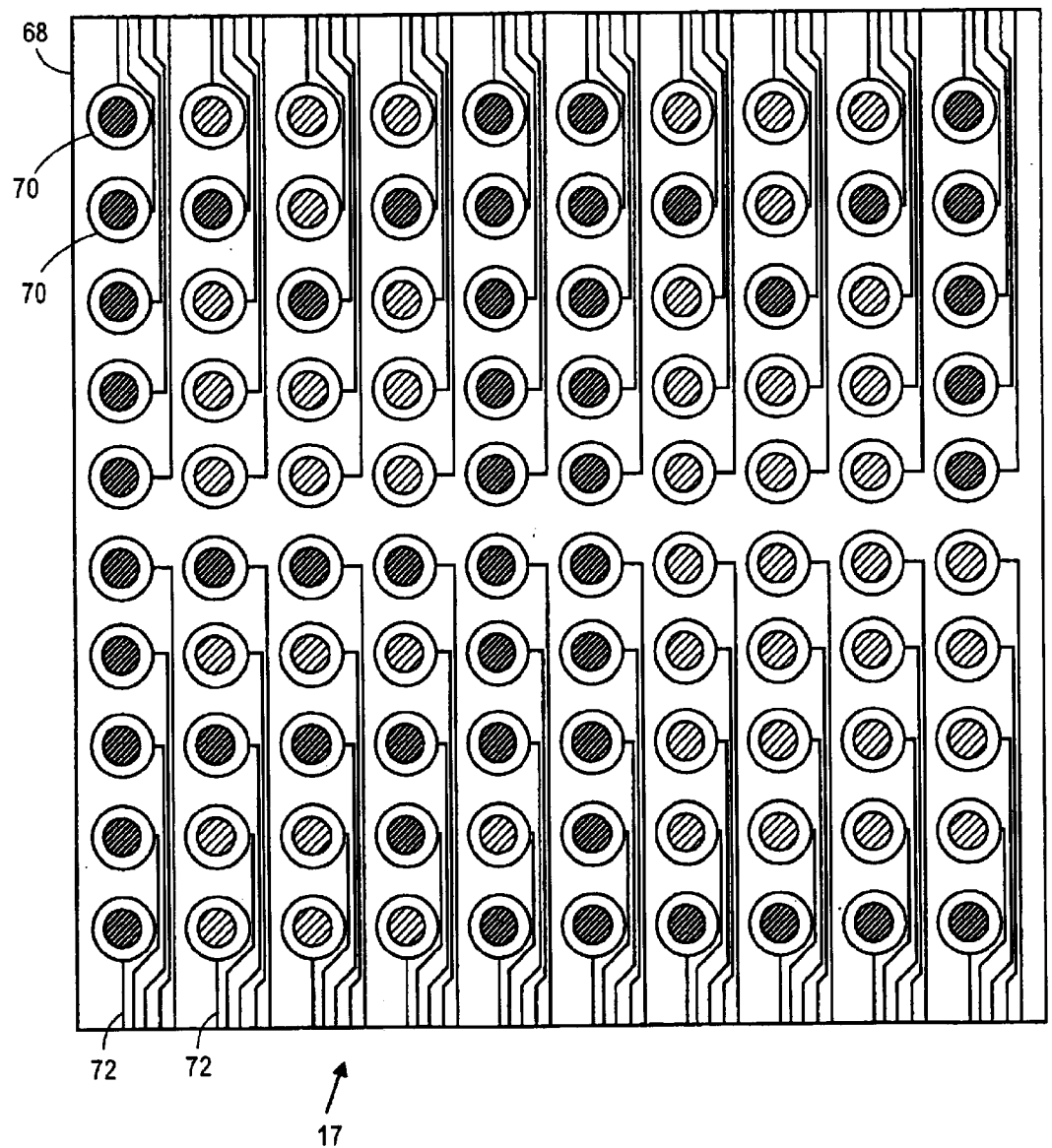

A large number of beamlets may be formed in a dot matrix arrangement as shown in FIG. 6C which illustrates a 10×10 beamlet array produced by the second electrode. The dark dots in the apertures represent a beam current coming out of the aperture while the light dots are apertures with no beam current. If the number of apertures is too large for fabrication, one can generate the desired pattern by using directional scanning. Instead of a large N×N matrix, a single or double column of apertures, as shown in FIGS. 6D, E, can be used. The beamlets in these columns are switched on and off as the wafer is moved mechanically in one direction.

Figure 7:
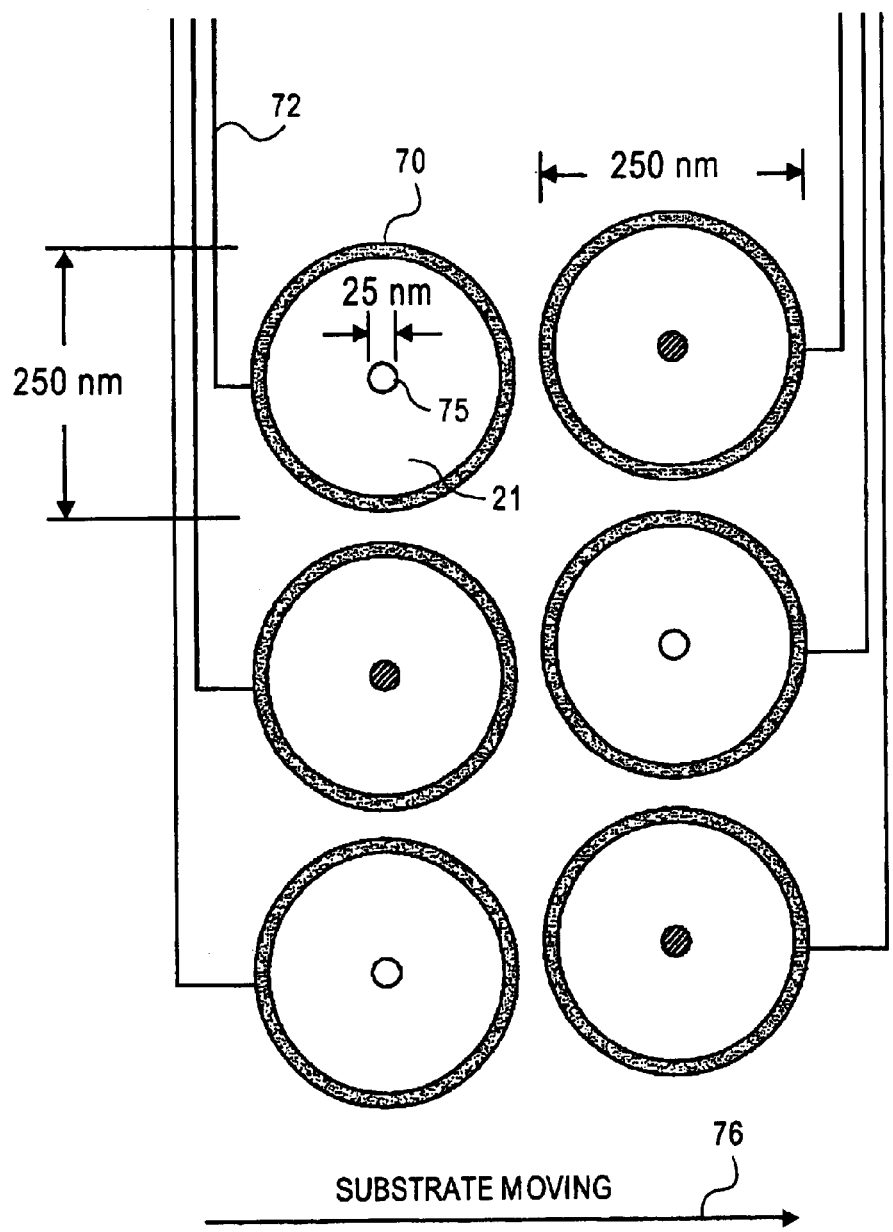
FIG. 7 illustrates beam switching, focusing and scanning.

Unlike the MMRL system, the beamlets will not be deflected electrostatically by means of a split lens electrode. Instead the substrate will be scanned mechanically in the x-direction. One can generate the desired pattern by combining beam switching and one dimensional mechanical scanning as shown in FIG. 7. Circular apertures will typically be used, with a diameter of about 250 nm, although even larger diameters up to 1 $\mu$m may be used. The aperture separation is much smaller. When these circular patterns are transferred to the resist with a reduction factor of about 10 to 30, small feature sizes are produced. For example, with a 250 nm aperture and 10 times demagnification, a 25 nm spot 75 shown in the center of aperture 21 will be produced on the resist. The wafer is scanned, i.e. mechanically translated in the direction of arrow 76.

c) Beam Focusing Effect

The invention provides a simple technique for focusing the accelerated beamlets without the use of an accelerator column. If the final beam spot size on the resist can be reduced substantially, then one can perform maskless ion beam lithography on large substrate area at sub-50 nm feature size with very high throughput.

Figure 8:
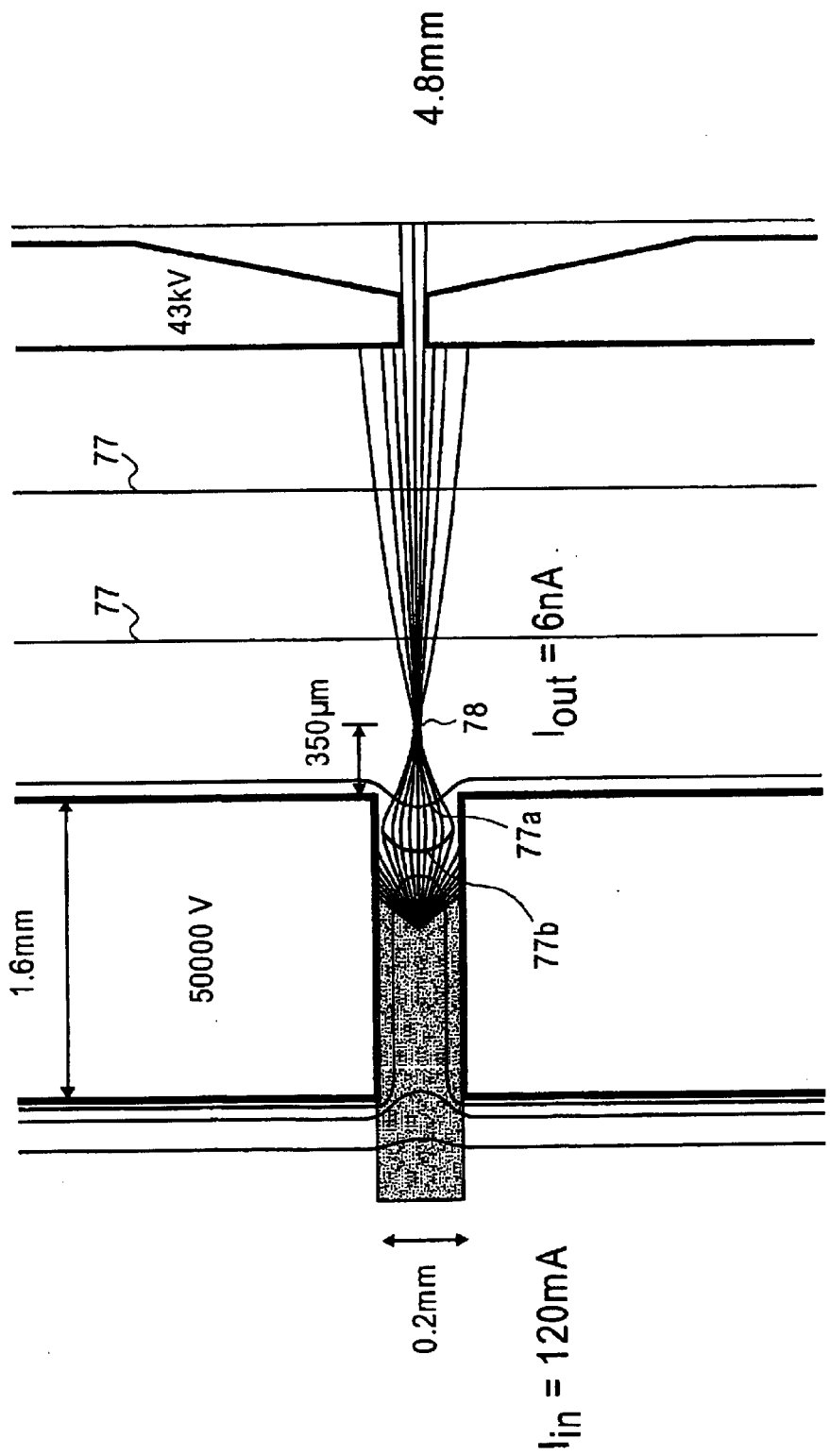
FIG. 8 is a computer simulation of the extraction of ion beams from a thick plasma electrode in a Focused Ion Beam (FIB) system, showing the equipotential lines and focusing effect.

If a voltage is applied between the second electrode of the pattern generator and the wafer substrate, the ions leaving the apertures will accelerate towards the resist layer. Since the equi-potential surfaces curve into the apertures, the ions will experience a focusing force just before they leave the second electrode. FIG. 8 is an IGUN computation result simulating the extraction of ion beams from a thick plasma electrode in a Focused Ion Beam (FIB) system. The equi-potential surfaces 77 are flat at a distance from the aperture. However, near the aperture, the equipotential surfaces 77a, 77b curve into the aperture, and this curvature provides a lensing effect. In this case the focal point 78 is located at a distance of 350 $\mu$m from the plasma electrode. The beam then diverges before reaching the extraction electrode. However, this phenomenon can be applied to the present invention by creating a similar effect at the extraction electrode of the MNBL system and placing the wafer very close so that the demagnified beam hits the resist.

Figure 9:
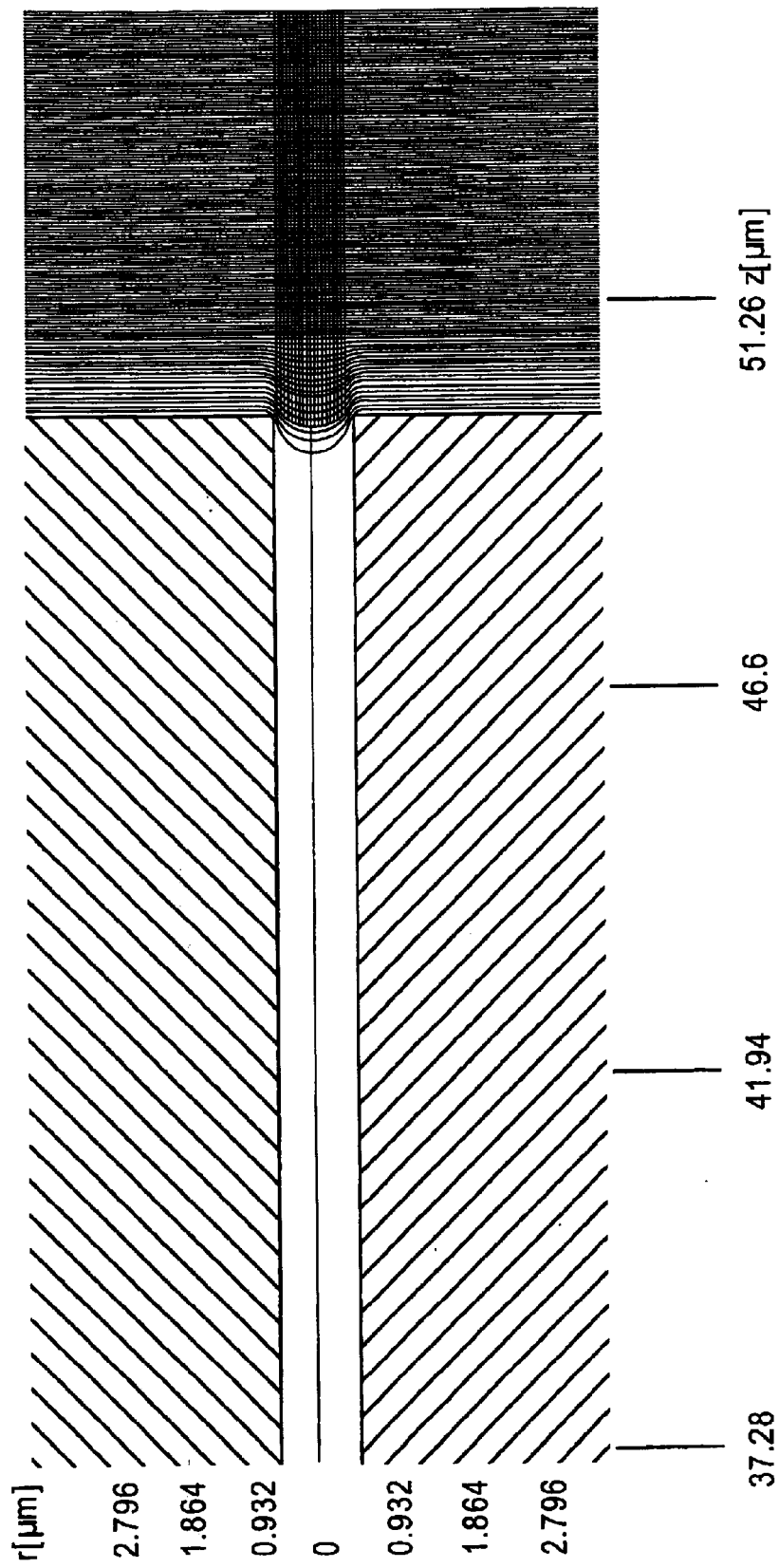
FIG. 9 is a computational result showing the ion trajectories of one beamlet in the pattern generator.
Figure 10:
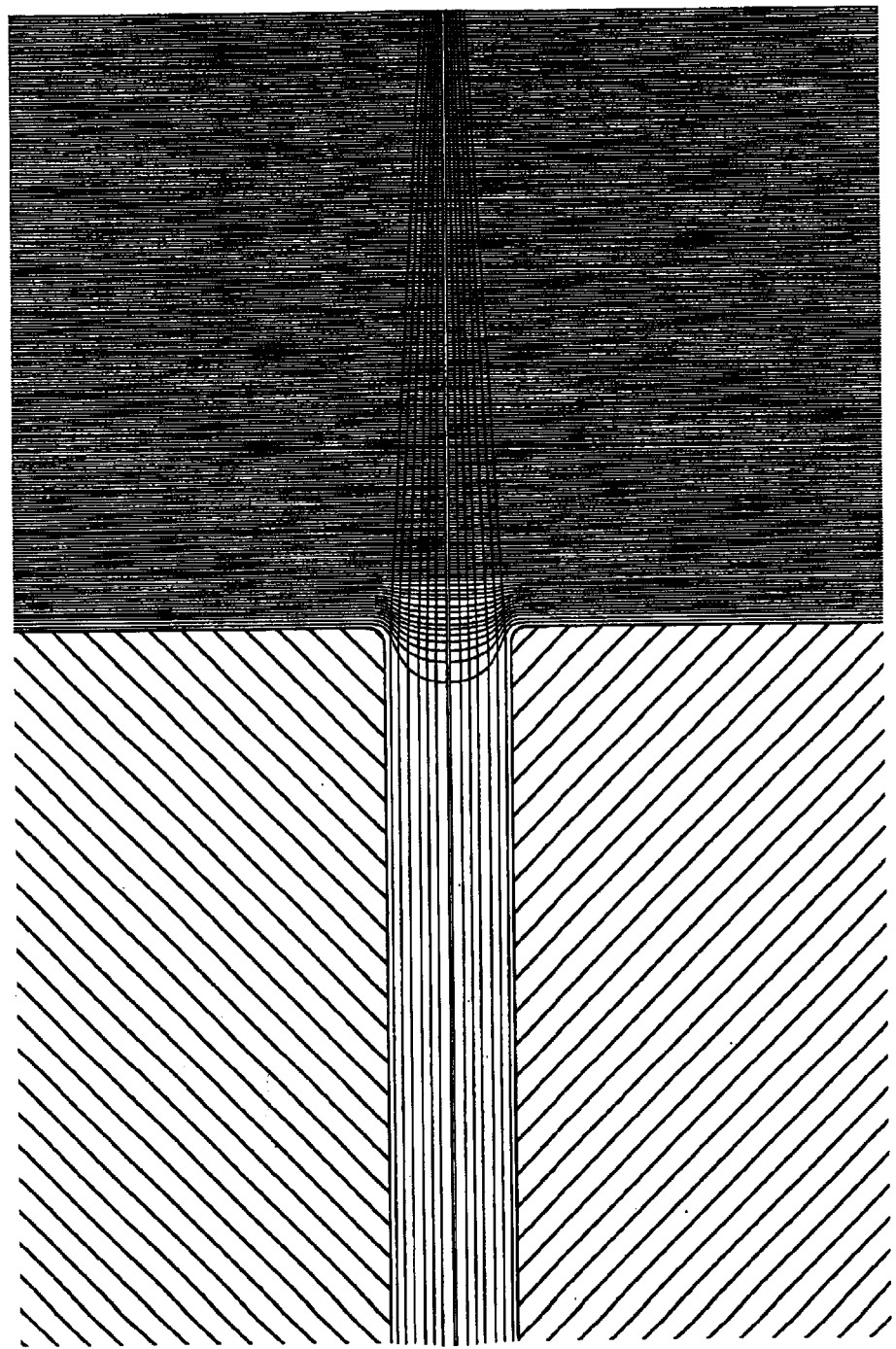
FIGS. 10–16 illustrate beam focusing as a function of various parameters including aperture size, voltage, plasma potential, and ion mass.
Figure 11:
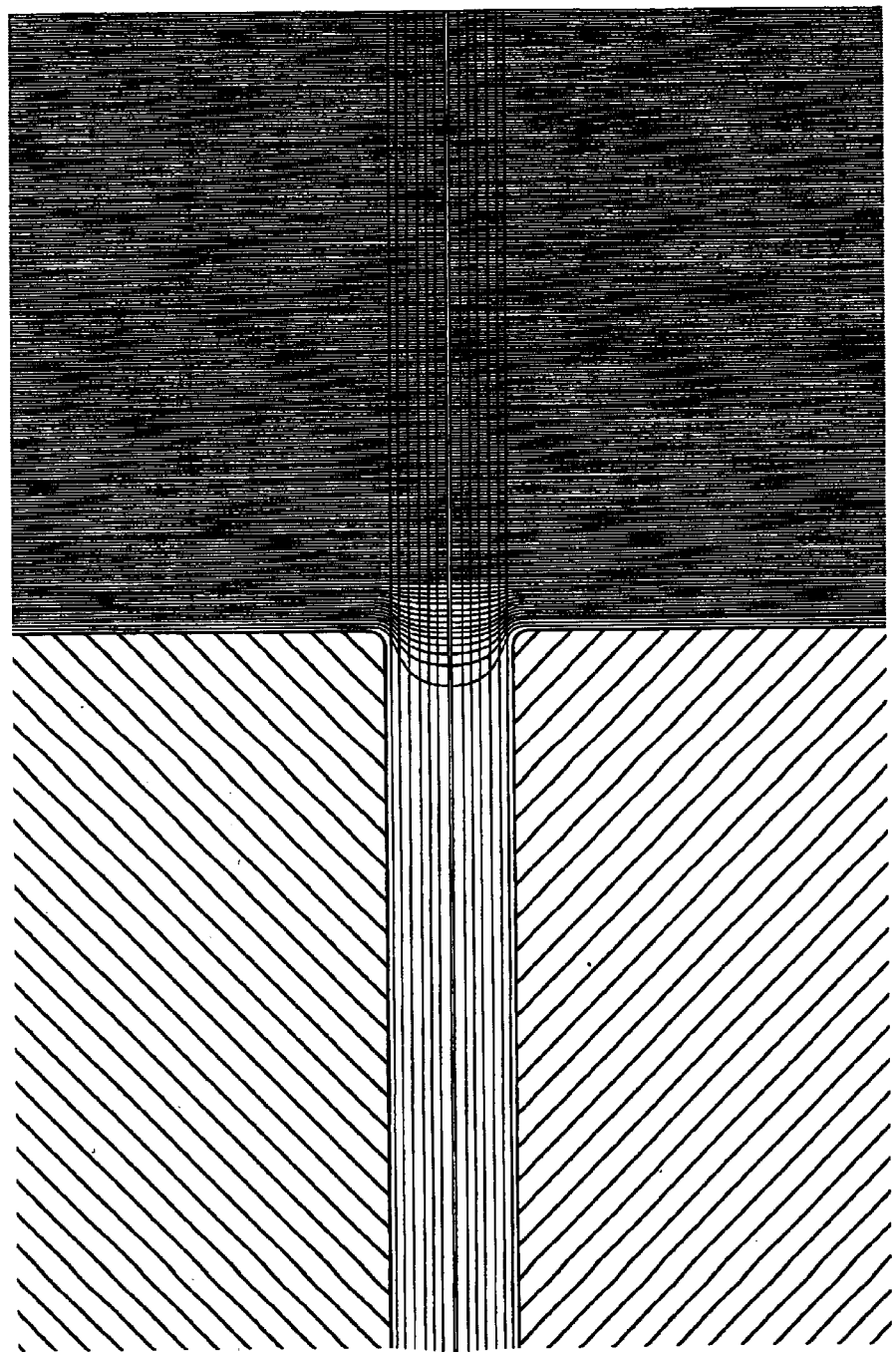
Figure 12:
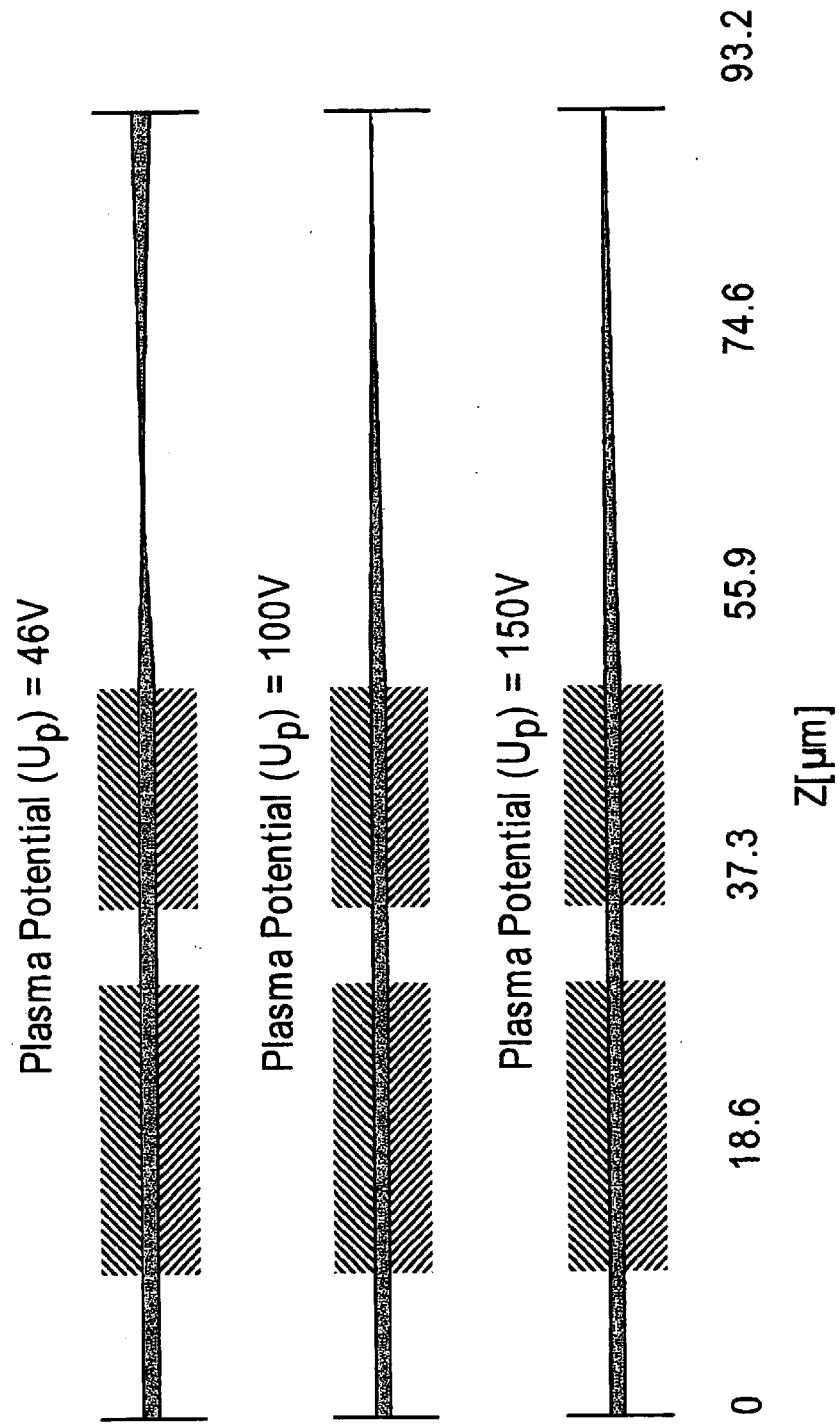
Figure 13:
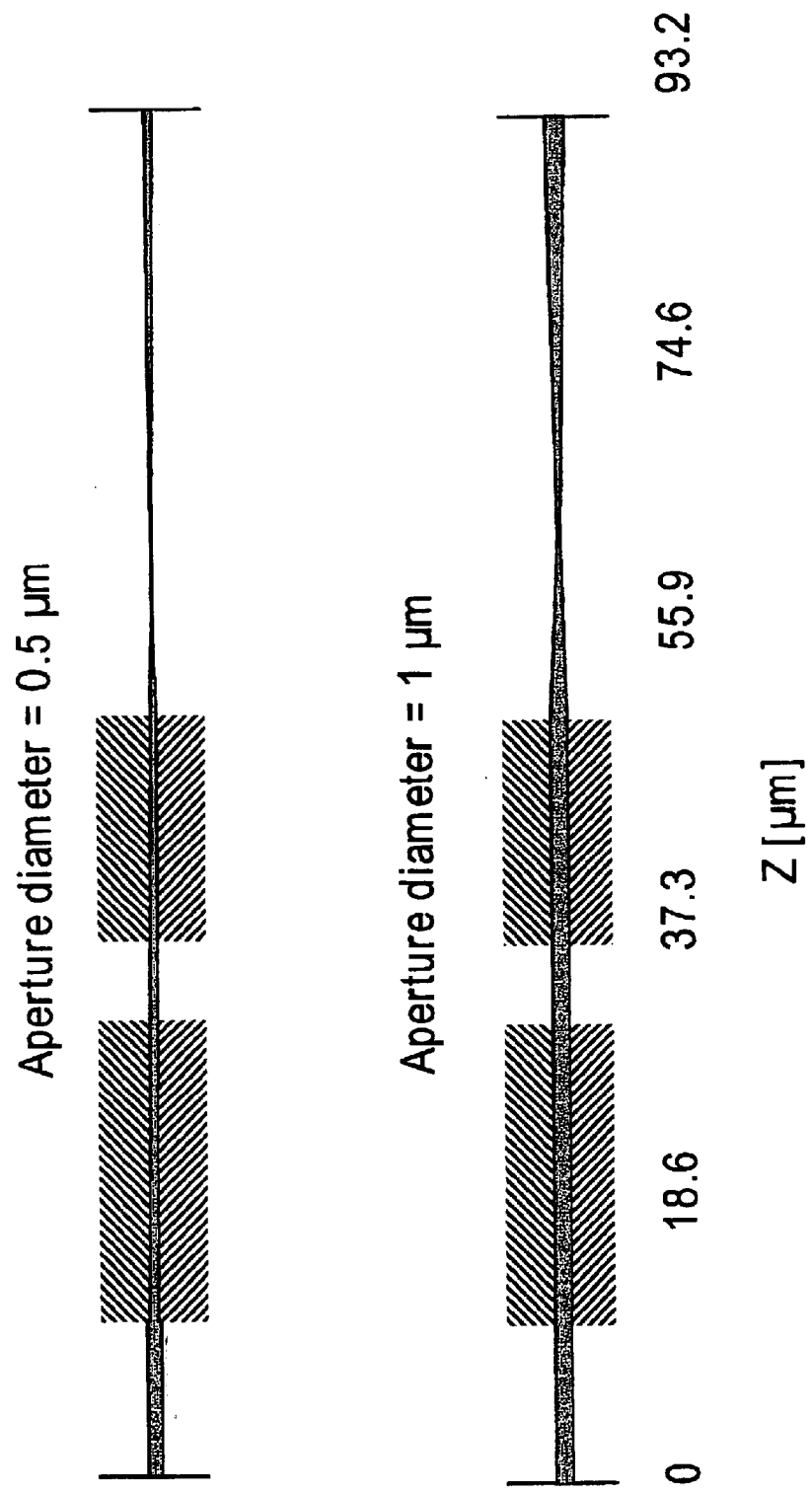
Figure 14:
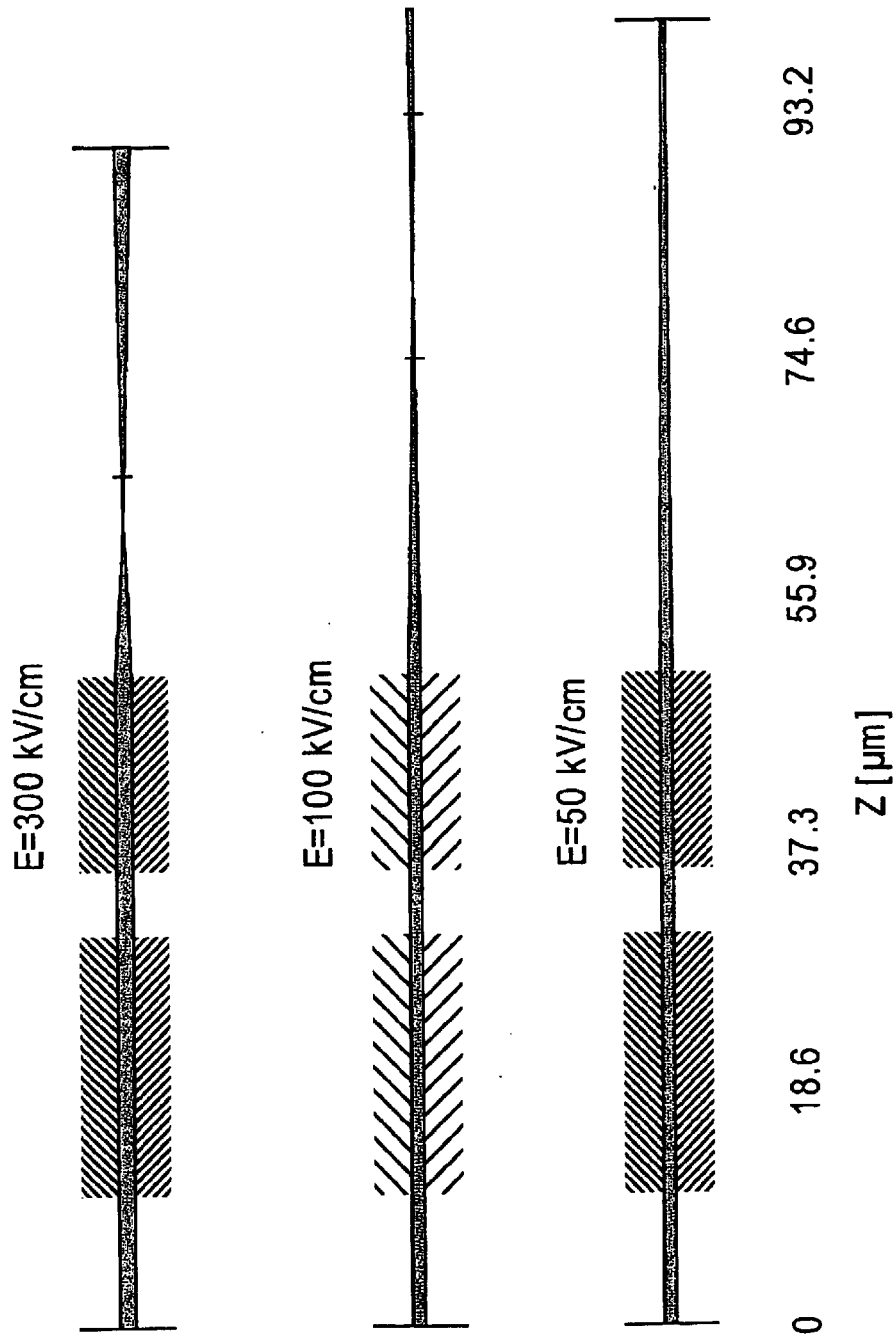
Figure 15:
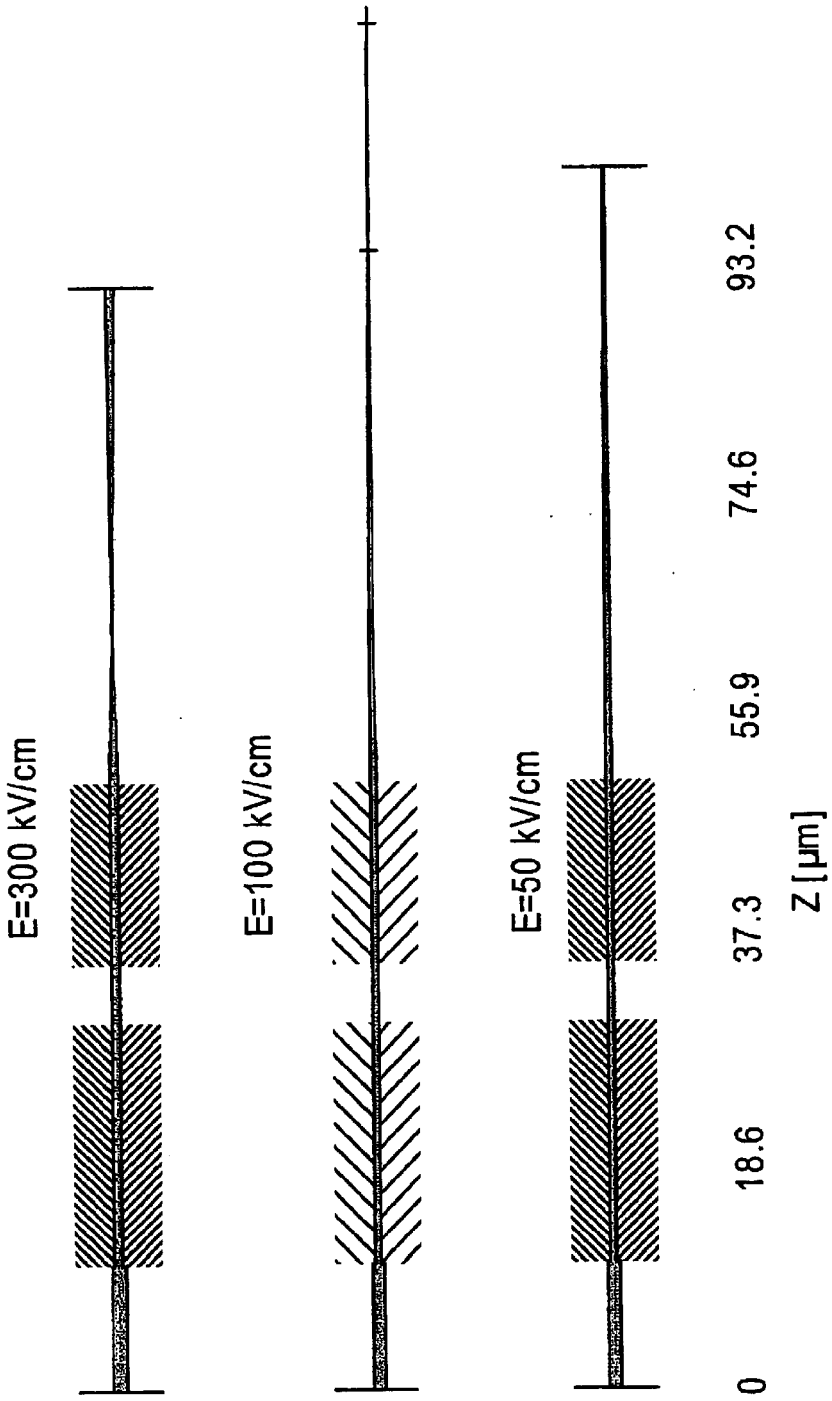
Figure 16:
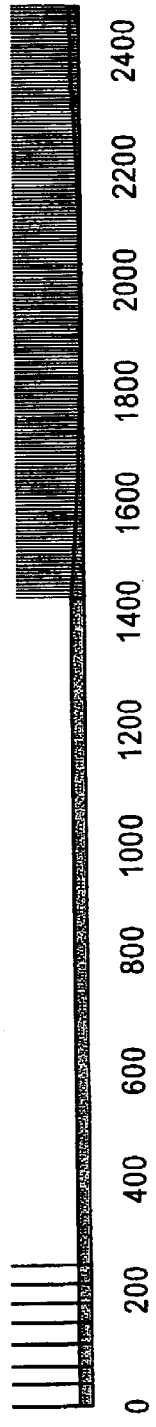

FIG. 9 is a computational result showing the ion trajectories of one beamlet in the pattern generator. Again one can see the distribution of the equi-potential surfaces which produces a focusing effect on the ion beam. In this case, one can project the ion trajectories to estimate the distance of the focal point which turns out to be approximately 650 $\mu$m. This simple ion focusing effect enables the reduction of the diameter of each beamlet by about a factor of 10. As a result, the beamlet spot size at the focal point will be ~25 nm for a 250 nm aperture. FIGS. 10–16 further illustrate the beam focusing as a function of various parameters including aperture size, voltage, plasma potential, and ion mass.

d) Voltage Holding and Resist Charging Issues

Figure 17:
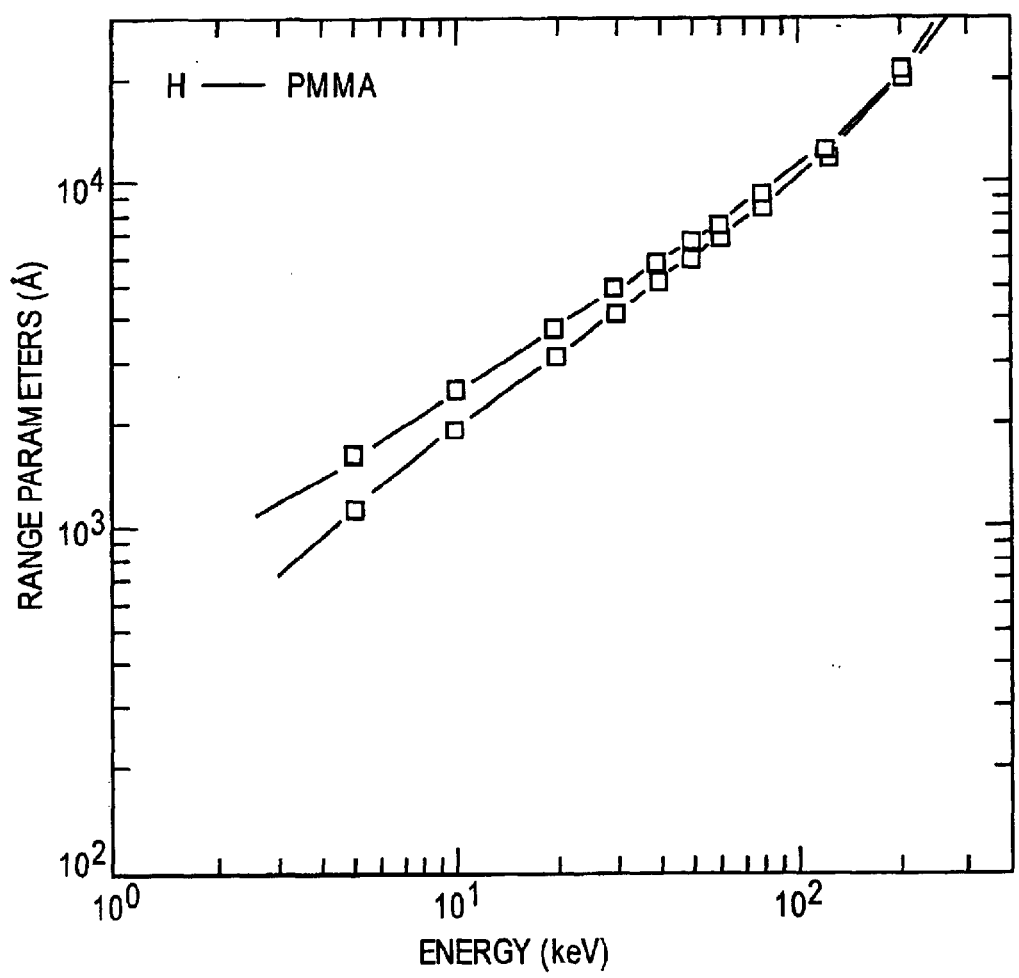
FIG. 17 is a Monte Carlo calculation of the ranges of $H^+$ ions in PMMA.
Figure 18:
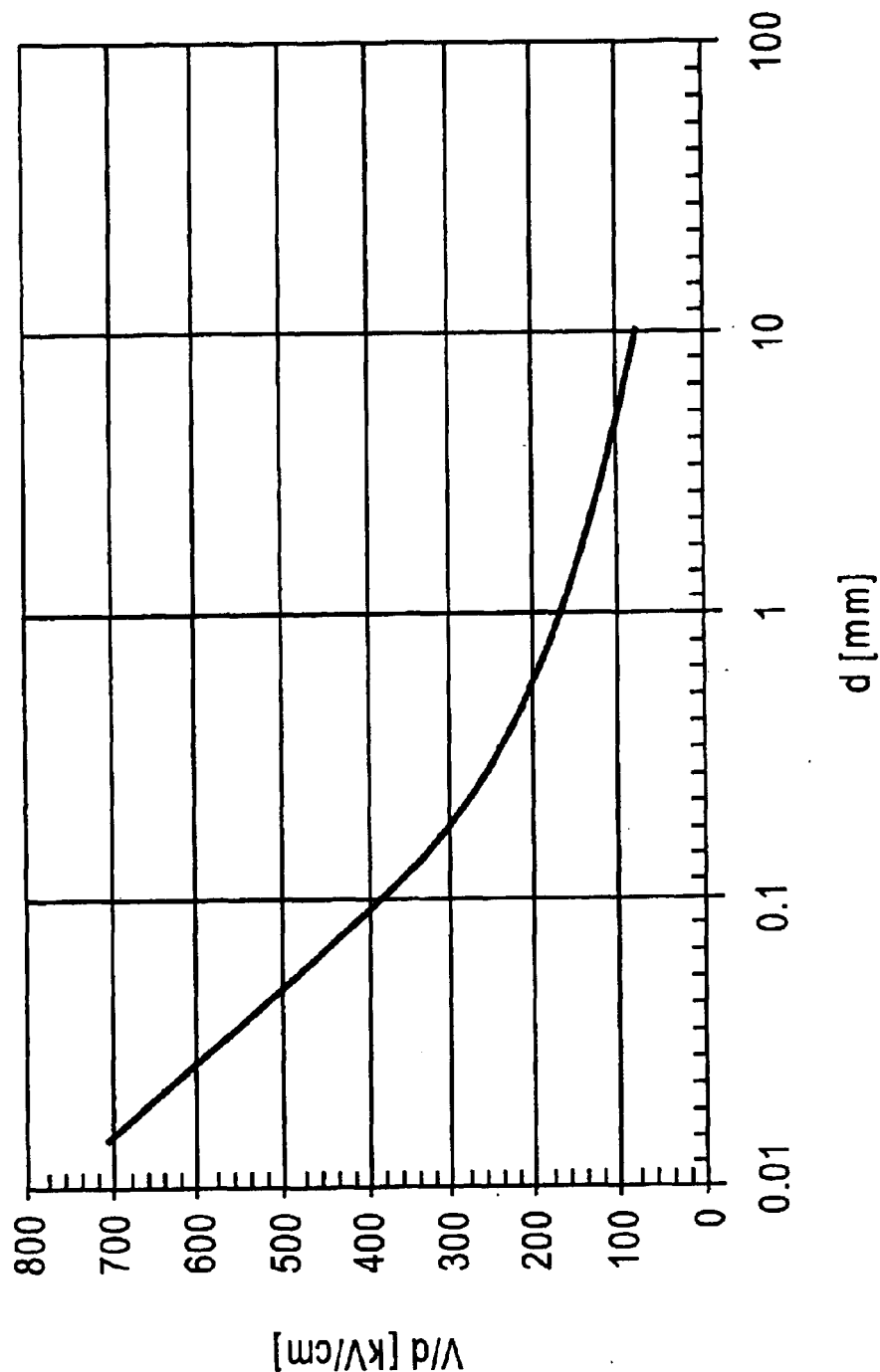
FIG. 18 is a graph of the voltage gradient as a function of gap width.

For resist exposure, one would prefer to have an aspect ratio (thickness of resist/feature size) of about 4. For feature size of 25 nm, the thickness of the resist should be ~100 nm. The exposure profile of H$^+$ ion beam in PMMA has been studied by Karapiperis et al. FIG. 17 is a Monte Carlo calculation of the ranges of H$^+$ ions in PMMA. In order to expose 100 nm thick PMMA, the required H$^+$ ion energy is about 5 kV. The breakdown limit for applying a dc voltage between two electrodes has been studied in many ion sources. An implicit formula derived by Kilpatrick is given by $$d=0.01414\ V^{3/2} \quad (1)$$

where d is the distance between the two electrodes in mm and V is the applied voltage expressed in kV. If the voltage between the pattern generator and substrate is 5 kV, then according to Eq. (1), the minimum distance between them is ~160 $\mu$m. Thus the pattern generator and substrate system can be operated without voltage breakdown with an applied voltage of 5 kV and at a separation of >160 $\mu$m. FIG. 18 is a graph of the voltage gradient as a function of gap width.

Voltage breakdown occurs when electrons are jumping from the negative to the positive electrode. When the H$^+$ ions impinge on the resist, secondary electrons are produced and they are accelerated back toward the pattern generator. These 5 keV electrons can cause damage on the pattern generator. One way to avoid this is to use H$^-$ ions rather than H$^+$ ions. As mentioned in section (a), the multicusp source can generate either positive or negative hydrogen ion beam. One can therefore simply switch the polarity of the high voltage power supply and accelerate H$^-$ ions to the resist. Since the pattern generator is more negative than the substrate, electrons emitted from the resist will not move backward.

Figure 19:
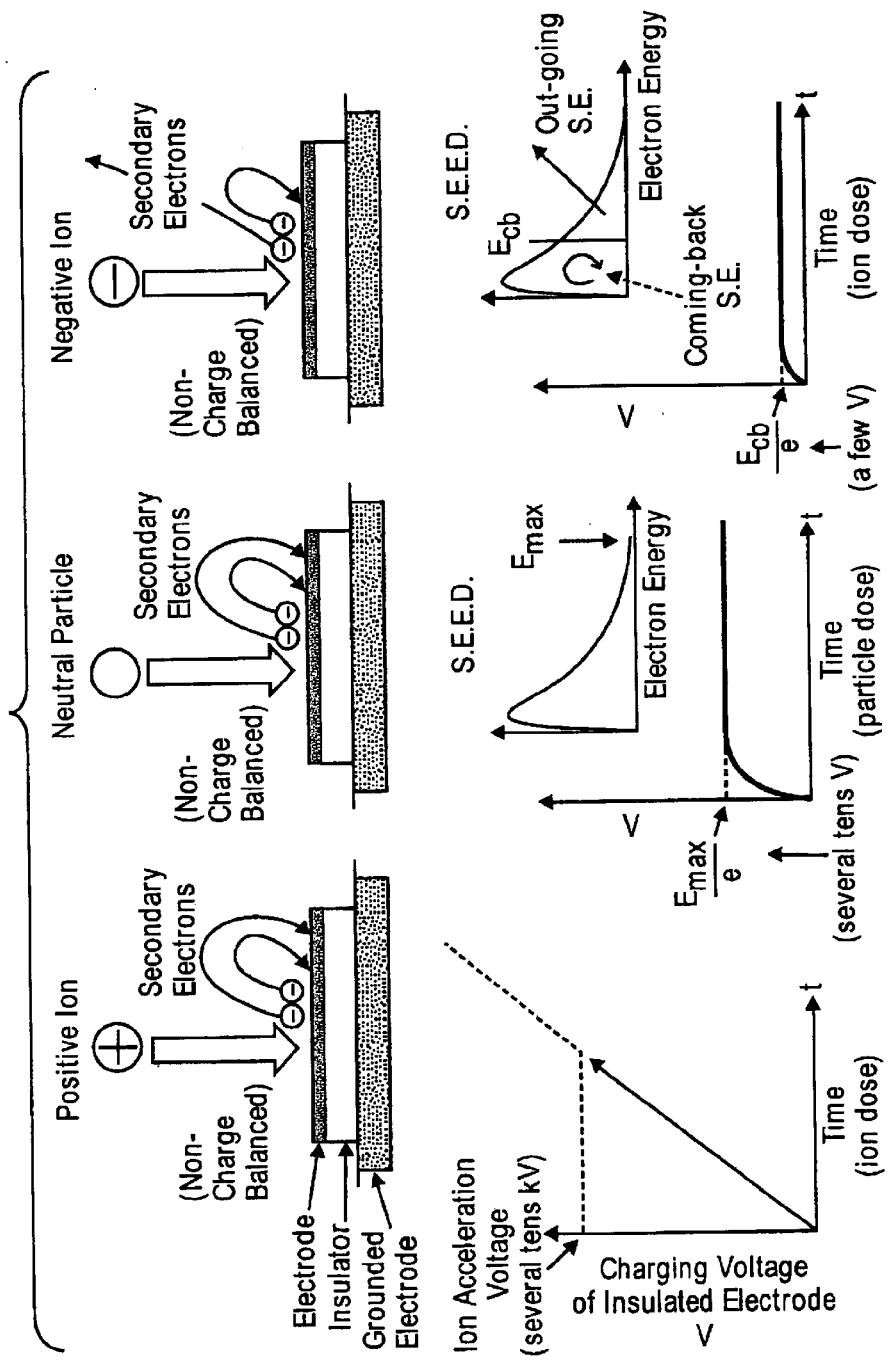
FIG. 19 shows the charging voltages of an insulated electrode implanted by positive ions, neutral particles, and negative ions.

Charging occurs when a positive ion beam impinges on an insulating material. If the charging voltage is high, voltage spark down may occur. Secondly, the incoming ion beam can be deflected sideways and therefore they will expose larger resist areas. If the feature size is small (e.g. 25 nm) this effect can generate CD control issues. The problem of beam charging has been studied in detail by Ishikawa in Japan. FIG. 19 shows the charging voltages of an insulated electrode implanted by positive ions, neutral particles, and negative ions. A negative ion has an extra electron which is easily released by colliding with other particles. The secondary electron emission coefficient for negative ions with energy greater than several keV is usually >1. The negative charge which should leave the electrode is approximately equal to the incoming charge of the negative ion to maintain the charge balance. When negative ions are implanted into insulators such as resist films and glass, the surface charging voltages are always quite low, within several volts. The use of H$^-$ ion beams in the MNBL tool should reduce voltage breakdown as well as resist charging problems.

e) Wafer Processing and Throughput

If one uses the MNBL tool to process 60 (300 mm) wafers per hour and assuming 30 sec for exposure, then the speed for exposure is about 20 cm$^2$/sec. Assuming the resist sensitivity is 20 $\mu$C/cm$^2$, the total charge required is 20 $\mu$C/sec or a current of 20 $\mu$A. For 25 nm lithography and assuming 250 nm apertures holes on the pattern generator with 16 gray scales, one needs 12 mA/cm$^2$ current density on the resist or 0.12 mA/cm$^2$ on the aperture holes. These current density values can be achieved very easily with the multicusp source for either H$^+$ or H$^-$ ions.

f) Lithography on Curve or Spherical Surface

Figure 20:
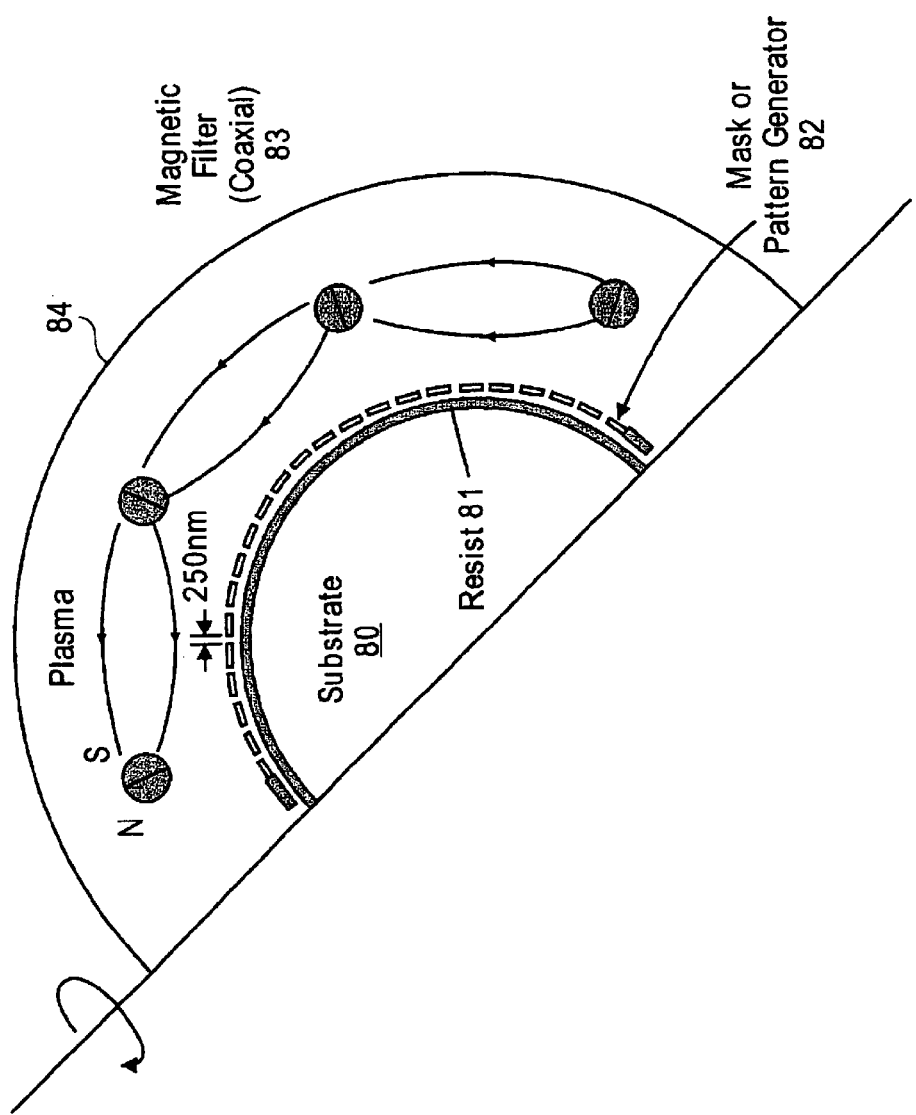
FIG. 20 illustrates the MNBL system applied to a spherical surface.

This plasma formed ion beam lithography technique can process flat or curved substrate surfaces. FIG. 20 shows the case when the technique is applied to a spherical surface, i.e curved substrate 80 coated with resist 81. The pattern generator 82 will also be curved to match the geometrical profile of the substrate. A coaxial magnetic filter 83 may be preferable in plasma ion source 84 because of its curved geometry. The substrate will be rotated on its axis and the beamlets on the pattern generator can be switched on or off to provide the desired patterns. Similar to the flat wafers, the feature size on the spherical surface can also be sub-50 nm.

g) Sub-50 nm Patterning on Thin Magnetic Film

Apart from maskiess resist exposure applications, the MNBL system can be used in patterning of magnetic media. The data density of magnetic disk drives is being increased at a rate of 100% per year. If this rate is sustained, the density will exceed 100 Gb/in$^2$ by year 2003, growing from current products which have densities of around 20 Gb/in$^2$. This growth in density has traditionally been accompanied by reduction of the grain size of the media, since to maintain signal-to-noise levels it is desirable to keep a constant number of grains per written bit in the granular media However, at some density below 100 Gb/in$^2$, this scaling approach will lead to grains so small that they are susceptible to thermally excited reversals of the magnetization direction, i.e., the grains will be super-paramagnetic. One approach to circumventing super-paramagnetization is to create magnetic bits that behave as single magnetic entities, e.g. either single domains or a collection of strongly coupled grains, rather than the hundreds of weakly coupled grains per bit found in conventional granular recording media.

Small islands of magnetic material have been formed using a number of techniques, including electron beam patterning, stamping and replication, holographic lithography, and others. All these techniques require some type of resist process and subsequent deposition or etch step, and significantly, they also require a cleaning process to remove all traces of resist from the same surface if they are to be used in a disk drive application. At the data density where such an approach, termed patterned media, may become necessary, the head-to-disk spacing will be in the range of 10 nm or less, and thus disk cleanliness will be of paramount importance. Thus, it is desirable to create discrete magnetic islands by non-contact patterning method, with each island representing a single magnetic bit.

One method of non-contact patterning of magnetic films is ion irradiation. As demonstrated by both IBM and by CNRS in Orsay, France, the magnetic anisotropy of multi-layer films, such as Co/Pt, can be lowered by interfacial mixing caused by ion irradiation. This results in a change in the direction of the easy magnetization direction from out-of-plane to in-plane. Alternatively, chemically ordered materials, such as the L1$_0$ phase of FePt, can be disordered by irradiation, resulting in a change in coercivity. Local areas of the film can be patterned using a uniform beam by placing a stencil mask between the beam source and the magnetic film. This can result in a high throughput, inexpensive, method of patterning an entire magnetic disk on a single exposure.

Patterned media are not likely to be required until an areal density is reached of over 100 Gbits/in$^2$, which corresponds to magnetic islands of approximately 40 nm in size. In addition, to be accepted as a new technology, it will need to be extendable to higher densities and smaller feature sizes. Reaching 1 Tb/in$^2$ would require 10 nm resolution lithography. This will be extremely difficult to achieve with a 1-1 printing process, and thus it is highly desirable to use a projection or reduction system. It is therefore most likely that if ion beam patterning is to be successful it will require a reduction system such as the MMRL or MNBL. This will enable 50 nm features to be patterned with stencil masks having 0.25–0.5 micron features. Such masks could be produced using standard optical lithography.

Accordingly, a method and apparatus have been provided for proximity print markless plasma-formed ion beam lithography with high demagnification factors without using a reduction system. The demagnification is obtained by a "self-focussing" effect obtained by the pattern generator/beam extractor.

Changes and modifications in the specifically described embodiments can be carried out without departing from the scope of the invention which is intended to be limited only by the scope of the appended claims.

What is claimed is:

1. A maskless nano-ion-beam lithography (MNBL) system, comprising:
   a plasma generator which produces ions in a plasma generation region;
   a pattern generator positioned adjacent to the plasma generation region of the ion source for electrostatically producing a controlled pattern of micro-ion-beamlets;
   a high voltage source connected between the pattern generator and workpiece for accelerating and focusing the micro-ion-beamlets extracted from the plasma generation region through the pattern generator to produce a demagnified final ion beam on the workpiece.

2. The MNBL system of claim 1 wherein the plasma generator comprises a multicusp ion source.

3. The MNBL system of claim 1 wherein the pattern generator comprises a two electrode blanking system.

4. The MNBL system of claim 1 further comprising a low voltage source connected to the pattern generator for applying voltages to the pattern generator to control individual beamlets.

5. The MNBL system of claim 1 wherein the pattern generator comprises a pair of spaced electrodes having a plurality of apertures therethrough, and a controllable voltage source connected to the two electrodes to electrostatically control the passage of each individual beamlet to form a predetermined beamlet pattern.

6. The MNBL system of claim 1 wherein the pattern generator comprises:
   a first electrode positioned adjacent to the ion source and having a first plurality of apertures formed therein for producing an array of micro-ion beamlets by passing ions from the ion source therethrough;
   a second electrode in a spaced relation to the first electrode and having a second plurality of apertures formed therein and aligned with the first plurality of apertures, the second electrode electrostatically and individually controlling the passage therethrough of each of the micro-ion-beamlets passing through the first electrode, split electrode Einzel lens for scanning the final ion beam over a workpiece.

7. The MNBL system of claim 1 further comprising a translatable mount for holding a workpiece onto which the final ion beam is directed.

8. The MNBL system of claim 5 having a demagnification factor of about 10 to about 30.

9. The MNBL system of claim 1 wherein the ion source is a source of positive or negative hydrogen ions.

10. A method of producing a focused ion beam comprising a plurality of beamlets in a predetermined pattern, comprising:

generating a plasma;

extracting ions from the plasma through a pattern generator which produces the predetermined pattern of beamlets;

applying a voltage between the pattern generator and a workpiece on which the ion beam is directed to produce a demagnified ion beam at the workpiece.

11. The method of claim 10 further comprising directing the ion beamlets onto a resist coated wafer.

12. The method of claim 11 wherein the step of extracting ions through a pattern generator is performed by forming the pattern generator of a pair of electrodes having a plurality of aligned apertures therethrough, and applying control voltages to the electrodes to enable or disable passage of each beamlet.

13. The method of claim 10 wherein the demagnification factor is about 10 to about 30.

14. The method of claim 10 further comprising forming sub-50 nm features on the workpiece.

* * * * *